United States Patent [19]
Shibano et al.

[11] Patent Number: 5,960,033
[45] Date of Patent: Sep. 28, 1999

[54] MATCHED FILTER

[75] Inventors: Toshinobu Shibano, Nara; Kunihiko Iizuka, Sakai, both of Japan

[73] Assignee: Sharp Kabushiki Kaisha, Osaka, Japan

[21] Appl. No.: 08/825,864

[22] Filed: Apr. 2, 1997

[30] Foreign Application Priority Data

Apr. 2, 1996 [JP] Japan ................................ 8-79959
Mar. 31, 1997 [JP] Japan ................................ 9-80922

[51] Int. Cl.$^6$ .................................................. H04K 1/00
[52] U.S. Cl. ................... 375/207; 375/343; 364/724.11; 327/551
[58] Field of Search .................. 375/207, 200, 375/343; 364/724.011, 724.11; 327/551

[56] References Cited

U.S. PATENT DOCUMENTS

| | | | |
|---|---|---|---|
| 5,737,368 | 4/1998 | Shou et al. | 375/343 |
| 5,841,315 | 11/1998 | Shou et al. | 327/552 |
| 5,844,937 | 12/1998 | Zhou et al. | 375/207 |

FOREIGN PATENT DOCUMENTS 7-94957  4/1995  Japan .

OTHER PUBLICATIONS

"Low Power Consumption Matched Filter LSI for Wideband DS–CDMA", M. Sawahashi et al. Technical Report of IEICE (Jan. 1996), The Institute of Electronics, Information and Communication Engineers.

"Matched Filter for DS–CDMA of up to 50MChip/s Based on Sampled Analog Signal Processing", T. Shibano et al., 1997 IEEE International Solid–State Circuits Conference pp. 100, 101, 439, 76, 77, 368 and 369.

"Yozan, NTT Develop Low–Power CDMA IC", Nikkei Electronics Asia, May 1996, News Focus Mobile Phone/Spread Spectrum, Nikkei Electronics Asia 1996.5.

"Yozan Spread–Spectrum, Matched Filter Features Low Power" G. Shou et al., Nikkei Electronics Asia, Aug. 1996 Design & Manufacturing, Nikkei Electronics Asia 1996.8.

*Primary Examiner*—Amanda Le

[57] ABSTRACT

A sample-hold circuit, which is constituted by a capacitor and a differential amplifier or a capacitor and an inversion amplifier, is provided with a first switch for short-circuiting the input and output, a second switch for switching the input-side terminal of the input capacitor to a reference voltage input, a third switch for switching the output-side terminal of the feedback capacitor to the reference voltage input, and a fourth switch for switching the input-side terminal of the input capacitor to an input voltage; thus a refreshing operation is available. Consequently, it is possible to compensate for deviations in offset voltage that are inherently caused by process deviations of MOS amplifiers, and to improve the precision of the output of the matched filter. Moreover, in addition to sample-hold circuits having conventional number of steps, a plurality of sample-hold circuits are added, and steps of shift registers, which have binary correlation filter coefficients stored therein, are also added as many as the same number of the added sample-hold circuits. Thus, during the refreshing operation, the extra circuits are used to carry out the process. With this arrangement, it becomes possible to provide a matched filter that is capable of refreshing the sample-hold circuits without adversely affecting the correlation output.

18 Claims, 15 Drawing Sheets

MATCHED FILTER

FIELD OF THE INVENTION

The present invention relates to a demodulation system for a system, such as a movable-body communication system and a radio LAN (Local Area Network) system, to which the spread spectrum system is applied, and more specifically concerns a matched filter used for synchronism acquisition and despreading.

BACKGROUND OF THE INVENTION

Research into communication systems using the spread spectrum technique have been carried out in earnest because those systems, which convert communication data with narrow bands into signals with wide bands by using the binary code sequence P(t) called PN (Pseudo-Noise) codes so as to transmit the resulting signals, have a higher efficiency in frequency usage and are capable of masking the presence and absence of communication and the contents of the communication more easily, as compared with other communication systems such as TDMA (Time Division Multiple Access) systems and FDMA (Frequency Division Multiple Access) systems. With respect to a demodulation system for the spread-spectrum communication systems, the application of matched filters has been studied in order to carry out the synchronism acquisition and despreading between received signals and the binary spread code sequence P(t) at high speeds.

Referring to FIG. 18, a brief explanation will be given of a conventional matched filter. The matched filter of FIG. 18 is a matched filter for carrying out correlation operations with m taps, and is provided with "m" number of sample-hold circuits 510 that are connected in cascade and that functions as a delay means. An analog signal Vin is applied to the sample-hold circuit 510 at the front-most step, and the sample-hold circuits 510 at the respective steps repeat sampling and holding for each input clock CLK. Thus, the sample-hold circuits 510 output an analog signal Vin that has been sampled in different synchronized timing with an input clock period Tc.

The analog signal Vin and the outputs of the respective sample-hold circuits 510 are applied to either an addition-related adder 507 or a subtraction-related adder 508 through switches 505. Here, it has been predetermined in accordance with the binary code sequence P(t) which of the respective adders 507 and 508 is selected by the switches 505. Further, a subtracter 509 subtracts the output of the subtraction-related adder 508 from the output of the addition-related adder 507, and outputs the result as a correlation output.

The correlation output in question has a peak value when the binary code sequence P(t) of the received signal and the binary code sequence P(t) of the matched filter are synchronous to each other; therefore, it is utilized for synchronism acquisition and despreading of the demodulation system.

Here, the conventional sample-hold circuits 510 are constituted by inversion amplifiers having ac-coupling capacitors at their inputs, and designed to continuously release the input voltage Vin at the time of cutoff of the input terminal. As illustrated in FIG. 19, in each inversion amplifier 520, a first-step inverter 527, a middle-step inverter 528 and an output-step inverter 529, and a high open-loop gain is obtained by cascade-connecting these inverters 527, 528 and 529.

However, the application of feedback to the amplifier having such a high gain with a great through-rate causes a problem of oscillations. Therefore, in order to prevent the oscillations, a resistor 531 is placed between the output of the middle-step inverter 528 and the power source Vcc, and a resistor 532 is placed between the output of the middle-step inverter 528 and ground. The application of the two balanced resistors 531 and 532 makes it possible to adjust the gain properly. Further, a capacitor 533 is placed between the output and ground so as to suppress the gain within the oscillation frequency bands. The combination of these resistors 531 and 532 and capacitor 533 prevents the inversion amplifier 520 from oscillating.

Moreover, the inversion amplifier 520 prevents an increase in power consumption due to dc currents by using an ac-coupling capacitor 525 at its input. Here, the closed-loop gain of the inversion amplifier 520 is represented by a capacitance ratio between the input capacitor 525 and a feed-back capacitor 526, since the open-loop gain is sufficiently large.

However, in the above-mentioned conventional inversion amplifier 520, since the input of the inverter serves as the gate of the MOS transistor, the connecting point 530 between the input capacitor 525 and the first-step inverter 527 is maintained in a floating state on a dc basis. The resulting problem is that since the initial charge is not controlled at the connecting point 530, the operation point is not determined in the inversion amplifier 520.

Therefore, when the inversion amplifiers 520 of this type are used in the sample-hold circuits 510 in a matched filter, the outputs of the multiple sample-hold circuits 510 that are used in the matched filter are subject to errors, because of offsets of the operation point of the individual inversion amplifiers 520. The resulting problem is degradation of the precision of the correlation output of the matched filter.

SUMMARY OF THE INVENTION

The objective of the present invention is to provide a matched filter which is capable of performing correlation operations with high precision.

In order to achieve the above-mentioned objective, the matched filter of the present invention, which, each time a predetermined input clock is inputted thereto, carries out correlation operations between an analog signal and correlation filter coefficients the number of which is not more than the predetermined maximum length, is provided with: sample-hold circuits of the capacitive-coupling type, which are placed in parallel with each other with the number being at least more than the maximum length, which hold sampled values of the inputted analog signal during the time in which the input clocks are applied at least as many as the number of the correlation filter coefficients, and which have refresh sections for setting an operational reference electric potential respectively; a correlation filter coefficient register which is constituted by first registers that are installed in association with the sample-hold circuits and which allows first register values to cyclicly shift step by step for each input clock, the first register values being stored in the respective first registers, and representing the correlation efficiencies that are to be combined with the corresponding sample-hold circuits at the cycle of the input clock; an operation means for carrying out correlation operations based upon the combinations of the first register values of the correlation filter coefficient register and the outputs of the corresponding sample-hold circuits; and sample-hold control means which are installed as many as the number of the steps of the sample-hold circuits in a cyclic manner and which, upon releasing to the corresponding sample-hold circuit a control signal indicating one of sampling, refreshing and holding states, outputs the control signal having the same contents as the control signal at the previous step in the cycle of the input clock took place immediately before.

In the above-mentioned arrangement, the operation means discriminates correlation filter coefficients corresponding to the outputs of the respective sample-hold circuits based upon the first register values of the corresponding correlation filter coefficient register, and carries out correlation operations between the analog signal and the correlation filter coefficients. The first register values of the correlation filter coefficient register are allowed to cyclicly shift step by step for each input clock; therefore, the output of each sample-hold circuit is subjected to a correlation operation with a correlation filter coefficient that has been offset in its order one by one for each input clock. Thus, during a period in which input clocks as many as the number of the correlation filter coefficients are applied, the outputs of the sample-hold circuits are subjected to correlation operations with all the correlation filter coefficients.

Moreover, when a refreshing operation is specified by the sample-hold control means, the refresh section of each sample-hold circuit sets the operational reference electric potential of the corresponding sample-hold circuit. Thus, offset errors resulting from process deviations during production of the sample-hold circuits, as well as offset errors due to leakage of charge from the capacitance during operation, are properly compensated. As a result, the sample-hold circuits makes it possible to sample and hold analog signal with extremely high precision.

Furthermore, the respective sample-hold circuits are arranged in parallel with each other. Thus, unlike conventional matched filters where the respective sample-hold circuits are connected in cascade, the sample-hold circuits make it possible to sample and hold the analog signal without being affected by other sample-hold circuits, even if the other sample-holding circuits are in the refreshing state.

Here, the sample-hold circuit in the refreshing state does not contribute to the correlation operation since it can not hold the input voltage. Therefore, even in the case when the refresh sections are installed in the sample-hold circuits, if the number of the sample-hold circuits is set to the same number as the correlation filter coefficients, it is not possible to maintain the sample values required for the correlation operations, thereby causing errors in the correlation operation outputs.

In contrast, in the arrangement of the present invention, since the number of the sample-hold circuits is set to be greater than the number of the correlation filter coefficients, the sample values required for the correlation operations are held by the remaining sample-hold circuits even if a certain sample-hold circuit is in the refreshing state. Therefore, the matched filter can refresh the sample-hold circuits without giving adverse effects on the correlation outputs.

In addition, the sample-hold control means releases a control signal that has the same contents as the control signal of the sample-hold control means at the previous step in the next cycle of the input clock. Consequently, the respective sample-hold circuits sequentially repeat the refreshing, sampling, and holding operations in one cycle of a period during which the input clocks are applied as many as the number of sampling and holding processes. Here, when the respective sample-hold circuits are mutually compared, their operations are delayed from the sample-hold circuit at the previous step by one cycle of the input clock. Further, the sample-hold control means carry out the same operations with only offset timing; therefore, the sample-hold control means can be constructed by using a shift register and a simple combinational circuit using.

Additionally, in order to replace the sample-hold circuits in the refreshing state, for example, it has been proposed that dedicated sample-hold circuits are provided. In this case, however, the dedicated sample-hold circuits should be arranged so that a sample-hold circuit that is to be replaced is selected in order for all the sample-hold circuits to be refreshed within a predetermined period. Further, the dedicated sample-hold circuits also need to be refreshed within a predetermined period, and during the refreshing period, they can not replace other sample-hold circuits. Therefore, in order to control the timing in which the dedicated sample-hold circuits replace other sample-hold circuits and also to control which sample-hold circuit should be selected, it is required to install a complicated circuit having sequential circuits, such as counters and flipflops, in addition to the above-mentioned circuit.

Moreover, with an arrangement wherein: sample-hold circuits of two systems are provided, and in the case of specifying the refreshing operation to the sample-hold circuits, the refreshing operation is specified to all the sample-hold circuits of one system, while the sample and hold operations are specified to all the sample-hold circuits of the other system, it becomes possible to further simplify the circuit used for controlling the sample-hold circuits. However, in this case, the number of the sample-hold circuits required is at least twice the number of the correlation filter coefficients. Therefore, the area required for the sample-hold circuit section and power consumption increase approximately twice as much.

In contrast, the matched filter of the present invention only requires the necessary number of extra sample-hold circuits for maintaining a period required for the refreshing operation. As a result, as compared with the installation of two systems, it is possible to reduce the number of the sample-hold circuits. Moreover, as compared with the installation of dedicated sample-hold circuits, it becomes possible to achieve the sample-hold control means by using a simpler construction.

As a result, it is possible to simplify the entire construction of the matched filter without increasing the circuit area and power consumption so much, and consequently to provide a matched filter capable of performing correlation operations with high precision.

Furthermore, in addition to the above-mentioned arrangement, it is possible for the matched filter to be further provided with: an output-suppressing register which is constituted by second registers that are installed in association with the sample-hold circuits and which allows second register values to cyclicly shift step by step for each input clock, the second register values being stored in the respective second registers, and indicating whether or not the output of the corresponding sample-hold circuit contributes to a correlation operation at the cycle of the input clock; multiplexors which are placed between the sample-hold circuits and the operation means and which select either the outputs of the sample-hold circuits or the operational reference electric potential so as to input them to the operation means; and a multiplexor control means which, if the second register value indicates no contribution to the correlation operation, allows the corresponding multiplexor to select the operational reference electric potential.

With this arrangement, the outputs of the sample-hold circuits that do not conform to the correlation filter coefficients are not inputted to the operation means. As a result, if the number of the correlation filter coefficients is not more than the predetermined maximum length, the correlation operations can be carried out accurately. Moreover, merely by setting the contents of the output-suppressing register, correlation operations between a desired number of correlation filter coefficients that is not more than the maximum length and the analog signal can be carried out with high precision. Consequently, the matched filter can be used in a shared manner between applications requiring the different numbers of the correlation filter coefficients.

Here, the effect of the output-suppressing registers that enables the correlation operations of not more than the predetermined maximum length can be obtained even in the case when no refresh sections are installed in the sample-hold circuits and when the number of the sample-hold circuits is the same as the above-mentioned maximum length.

Furthermore, in addition to the above-mentioned arrangements, it is preferable for each of the sample-hold circuits to be further provided with a switch that is installed at the output terminal of the sample-hold circuit and that disconnects the output of the sample-hold circuit from the succeeding step during the period in which the sample-hold control means is outputting a control signal indicating the sample operation. With this arrangement, during the sample period, the outputs of the sample-hold circuits are cut off from, for example, wiring load up to the operation means and input load in the operation means. This makes it possible for the sample-hold circuits to acquire the analog signal with high speeds. Therefore, it is possible to improve he input clock frequency of the matched filter, and also to carry out correlation operations of, for example, high-frequency spread signal with high precision.

Moreover, in addition to the above-mentioned arrangements, it is preferable to install the following two components in the respective sample-hold circuits. One component is a multiplexor that is placed between the corresponding sample-hold circuit and the operation means and that selects either the output of the sample-hold circuit or the operational reference electric potential, and then inputs the result to the operation means; and the other is a multiplexor control means which, during a period including at least one of the periods in which the sample-hold control means at the corresponding step is outputting the control signal indicating the sample operation and in which it is outputting the control signal indicating the refreshing operation, allows the multiplexor to select the operational reference electric potential.

With this arrangement, during a period such as the sample period and refreshing period in which the outputs of the sample-hold circuits become unstable, the outputs in question are not inputted to the operation means. In particular, in the case when, during both of the sample period and refreshing period, the outputs are blocked from entering the operation means, only the outputs of the sample-hold circuits in the holding state are allowed to enter the operation means. Consequently, the operation precision of the matched filter is further improved.

For a fuller understanding of the nature and advantages of the invention, reference should be made to the ensuing detailed description taken in conjunction with the accompanying drawings.

DESCRIPTION OF THE EMBODIMENT

Embodiment 1

Referring to FIGS. 1 through 15, the following description will explain a matched filter related to one embodiment of the present invention. Here, the matched filter has been known as a particularly effective means for synchronism acquisition of a received signal at high speeds, for example, in the spread-spectrum communication; therefore, an explanation will be given below by exemplifying a case wherein the matched filter is applied to a receiving circuit of the spread-spectrum communication system such as a movable-body communication and radio LAN (Local Area Network).

In the spread-spectrum communication system of the DS (Direct Spreading) method, a binary data sequence $J(s)$, which represents the communication contents, is converted into a spread continuous signal A1 with a wide band by using a binary spread-code sequence P(t) called PN (Pseudo-Noise) codes, and then transmitted. In other words, the binary data sequence $J(s)=\{j_0, j_1, \ldots, j_s$: s represents a natural number$\}$ is taken into consideration. The binary spread-code sequence $P(t)=\{p_0, p_1, \ldots, p_t$: t represents a code period of $P\}$ is also taken into consideration. Here, a spread data set K (s, t) is formed by using J(s) xnor P(t). The factors of the set K are arranged in the order $\{k_{00}, k_{01}, \ldots, k_{0t}, k_{10}, k_{11}, \ldots, k_{1t}, \ldots, k_{s0}, k_{s1}, \ldots, k_{st}\}$. Further, the factors, aligned in this order, are subjected to a binary amplification modulation by using a spread clock on a time basis; thus, the spread continuous signal A1 is generated.

The spread continuous signal A1, transmitted by a transmitter, is subjected to disturbances from the communication lines, and becomes a received signal A2 in a receiver. Further, the receiver demodulates the received signal by using a clock that is the same as the spread clock, and calculates "xnor" between the demodulated signal and the binary spread-code sequence P(t) in the same manner as the time of transmission. Thus, the receiver recognizes the binary data sequence J(s) that indicates the contents of the communication.

Research into the spread-spectrum communication system has been carried out in earnest because the system has a higher efficiency in frequency usage and is capable of masking the presence and absence of communication and the contents of the communication more easily, as compared with other communication systems such as TDMA (Time Division Multiple Access) systems and FDMA (Frequency Division Multiple Access) systems.

Figure 2:
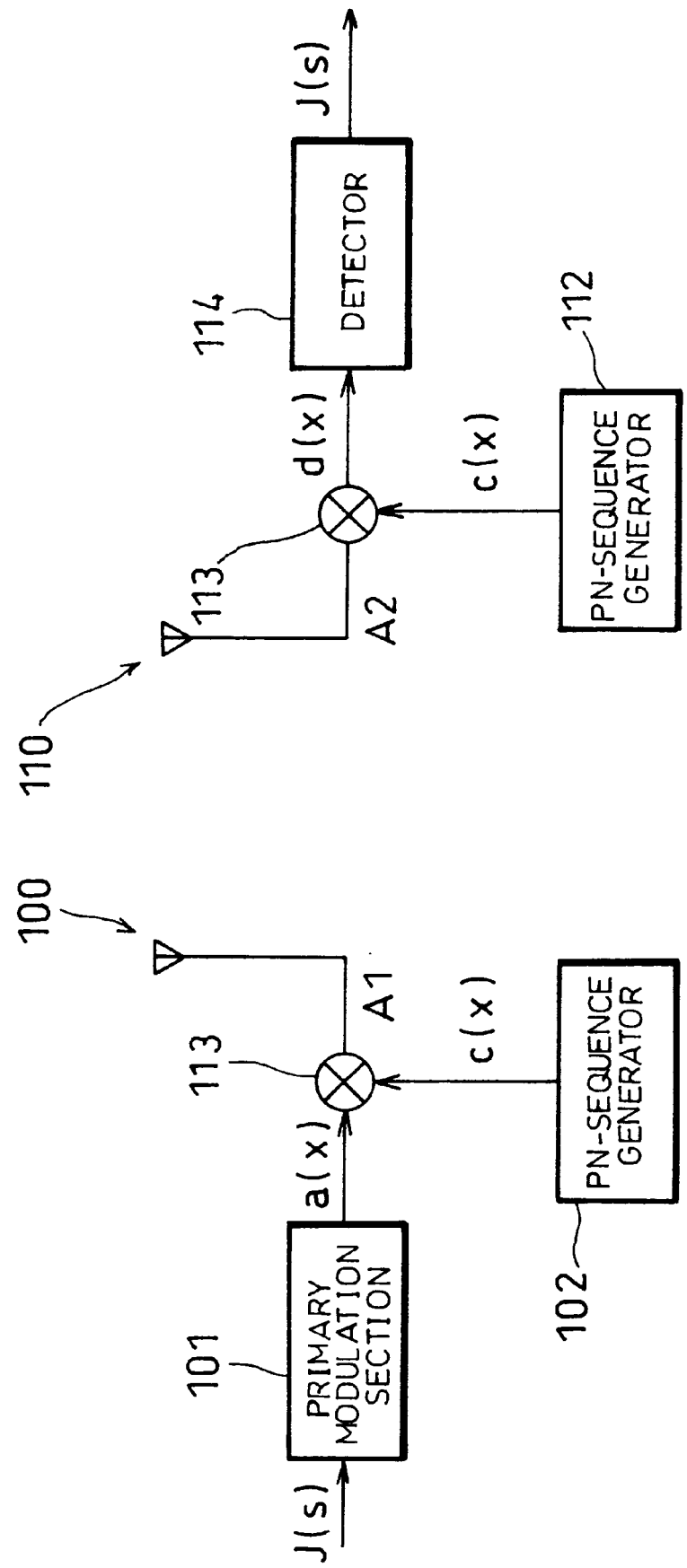
FIG. 2 is a block diagram showing a spread-spectrum communication system in connection with the above-mentioned embodiment.

Here, the timing at which the binary amplification modulation is carried out may be set before the data set K has been formed; therefore, in an actual transmitter 100, the spread modulation is carried out after the primary modulation as shown in FIG. 2. More specifically, a primary modulation section 101 modulates the binary data sequence J(s) by using a PSK (Phase Shift Keying) method. Further, a PN-sequence generator 102 outputs "1" when the binary spread-code sequence P(t) takes one of the binary digits, and outputs "-1" when it takes the other digit. Moreover, a multiplier 103 multiplies a primary modulation wave a(x) and the output c(x) of the PN-sequence generator 102 so as to generate a spread continuous signal A1. Hereinafter, a phase-switching interval of the primary modulation waveform is referred to as a 1 bit-section width T, and a phases-witching interval of c(x) is referred to as a chip-section width Tc.

Similarly, in the receiver 110, the PN-sequence generator 112 outputs the same signal c(x) as the PN sequence used at the time of transmission, and the multiplier 113 multiplies the output c(x) and the received signal A2. Consequently the received signal A2 is returned to the primary modulation signal d(x). Further, a detector 114 reproduces the binary data sequence J(s) from the signal d(x).

Here, in order to decode the received signal A2 correctly, the received signal A2 and c(x) are made synchronous to each other. Therefore, a matched filter, which carries out correlation operations between them, is used for executing synchronous acquisition at high speeds.

In other words, the matched filter of the present embodiment carries out correlation operations between a binary correlation-operation filter-coefficient sequence P(t) (t represents an integral number indicating the length of the sequence P) that is successively given at a predetermined cycle Tc and an analog input signal Vin. When a sample-value sequence, which is made of sampled values s(1), s(2), . . . that have been sampled from the analog input signal Vin at the cycle Tc, is represented by S(i) (i represents an arbitral integral number), the correlation output Z(x), obtained in the case of calculations using the sample-value sequence S(i) up to the time x, is represented by the following equation (1):

$$Z(x)=\Sigma\{S\ (x-j)\cdot F\ (t-j)\} \quad (1)$$

(where j is an integral number satisfying $0\leq j<t$). Here, F(j) is a function which takes "1" when the value of P(j) is one of the binary digits, and takes "-1" when the value of P(j) is the other thereof. Further, the binary correlation-operation filter-coefficient sequence is hereinbelow simply referred to as the correlation filter coefficient sequence, and its elements are referred to as correlation filter coefficients. Additionally, when applied to synchronous acquisition, the correlation filter coefficient sequence is properly set in accordance with the binary spread-code sequence at the time of transmission.

In the above-mentioned equation (1), when the analog input signal and the correlation-filter coefficient P(t) are synchronous to each other, the signs of S $(x-j)\cdot F$ $(t-j)$ become all the same except for portions that have been altered by disturbances. As a result, the correlation output Z(x) indicates a peak value. In contrast, when both of them are not synchronous to each other, the signs of S $(x-j)\cdot F$ $(t-j)$ are not the same, and the magnitude of the correlation output Z(x) is maintained at a low value. Therefore, synchronous acquisition of the two can be carried out at high speeds by detecting the peak value of the output Z(x) of the matched filter.

The above-mentioned equation (1) is transformed as follows by using a function F1(j) which becomes "1" in the case of "1" of F(j) and becomes "0" in the other cases of F(j) as well as a function F2(j) which becomes "1" in the case of "-1" of F(j) and becomes "0" in the other cases of F(j):

$$Z(x)=\Sigma\{S\ (x-j)\cdot F1(t-j)\}-\Sigma\{S\ (x-j)\cdot F2(t-j)\} \quad (2)$$

(where j is an integral number satisfying $0\leq j<t$).

Figure 1:
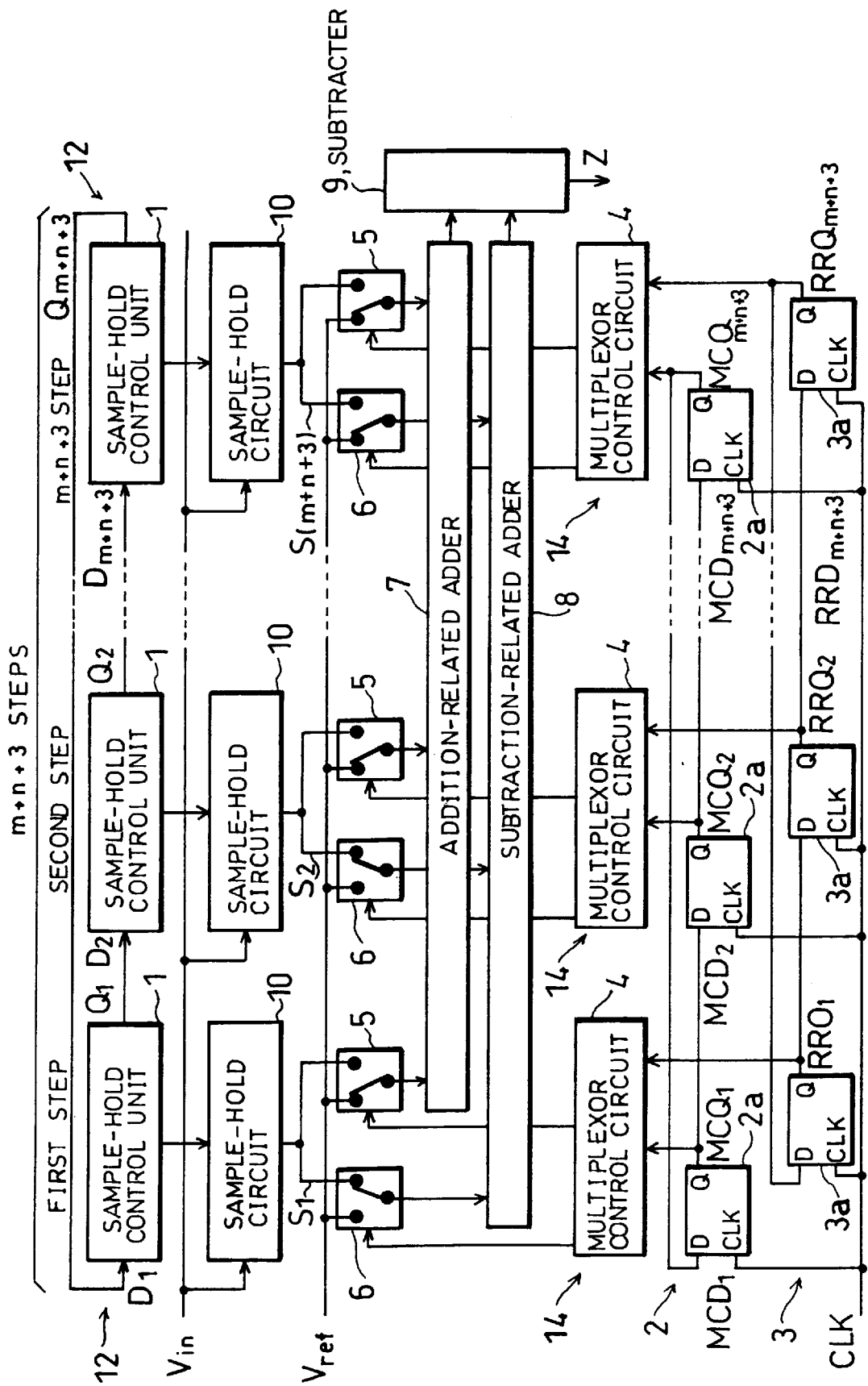
FIG. 1 is a block diagram showing an arrangement of a matched filter of one embodiment of the present invention.

The matched filter of the present embodiment is designed to output the correlation operation Z(x) in accordance with the above-mentioned equation (2), and as illustrated in FIG. 1, it is provided with sample-hold circuits 10 for holding the sample-value sequence S(i). In the present embodiment, the respective sample-hold circuits 10, which are connected in parallel with each other, are designed not only to sample the input analog signal Vin and hold for a predetermined period, but also to carry out refreshing operations as will be described later. Moreover, supposing that the maximum value of the cycle t of the binary spread-code sequence P(t) is m, the number of the sample-hold circuits 10 is set at m+n+3 so that even if any of the sample-hold circuits 10 cannot be used for correlation operations due to the refreshing operation or other operations, the correlation operations can be carried out correctly by using the outputs of the remaining sample-hold circuits 10. Here, as will be described later, n represents a constant that is determined based upon the period required for the sample-hold circuit 10 to refresh.

Figure 3:
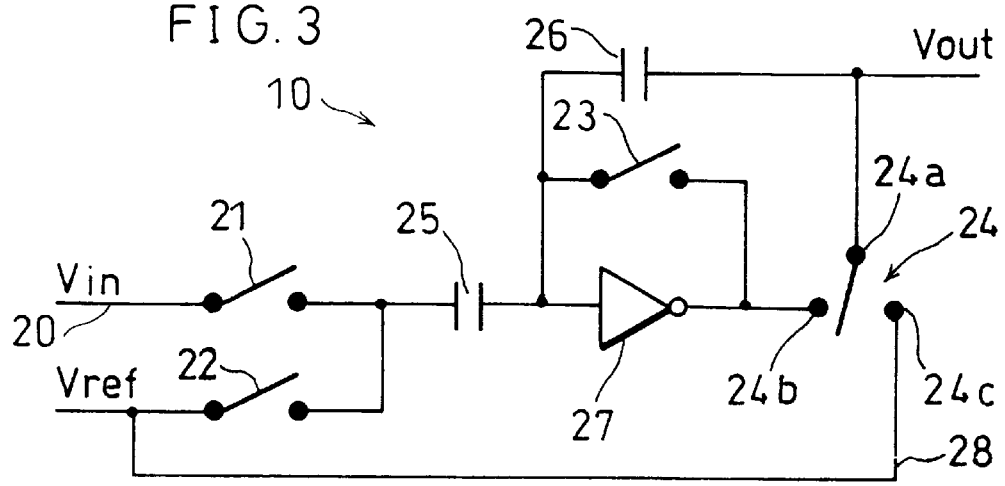
FIG. 3 is a circuit diagram showing a sample-hold circuit with a refresh circuit in accordance with the above-mentioned embodiment.

Each of the above-mentioned sample-hold circuits 10 has the same construction regardless of which step it is connected to, and is provided with a refresh means. More specifically, as illustrated in FIG. 3, the sample-hold circuit 10 of the present embodiment, which is a sample-hold circuit of a capacitive-coupling type, has an inverter 27, a feedback capacitor 26 placed across the input of the inverter 27 and the output terminal of the sample-hold circuit 10, and an input capacitor 25 that is placed across a signal line 20 for supplying the analog signal Vin and the input of the inverter 27. Further, the sample-hold circuit 10 has switches 21 through 24, as a refresh means, that are controlled by the sample-hold control unit 1 shown in FIG. 1.

The switch 21 is placed between the signal line 20 and the input capacitor 25. The switch 22 has its one terminal connected to the input side of the capacitor 25, with the other terminal being connected to a power-source line 28 for supplying a reference voltage Vref. Further, the switch 23 is placed across the input and output of the inverter 27. Here, the common contact 24a of the switch 24 is connected to the output end of the sample-hold circuit 10, and one of discrete contacts 24b is connected to the output terminal of the inverter 27, and the other discrete contact 24c is connected to the power-source line 28.

During a refreshing operation, the switch 21 is turned off, the switch 22 is turned on, the switch 23 is turned on, and the switch 24 is connected to the Vref side. Supposing that the inherent offset voltage of the inverter 27 is Voff, the charge Q that has been accumulated in the input capacitor 25 and the feedback capacitor 26 is represented by equation (3):

$$Q=Ci \cdot (Vref+Voff-Vref)+Cf \cdot (Vref+Voff-Vref)=(Ci+Cf) \cdot Voff \qquad (3)$$

Here, Ci represents an electrostatic capacity of the input capacitor 25, and Cf represents an electrostatic capacity of the feedback capacitor 26. During the normal operation, the switch 21 is turned on, the switch 22 is turned off, the switch 23 is turned off, and the switch 24 is connected to the output of the inverter 27. At this time, supposing that the operational electric potential at the time of short-circuiting of the input and output of the inverter 27 is Vg, the charge Q that has been accumulated in the input capacitor 25 and the feedback capacitor 26 is represented as follow:

$$Q=Ci \cdot (Vg-Vin)+Cf \cdot (Vg-Vout)=(Ci+Cf) \cdot Voff \qquad (4)$$

Here, since Vg=Vref+Voff, the substitution of this into equation (4) yields:

$$Vout-Vref=-(Ci/Cf)(Vin-Vref) \qquad (5)$$

Thus, it becomes possible to completely eliminate adverse effects of the offset voltage Voff due to process variations, etc. The application of the sample-hold circuits 10 to a matched filter makes it possible to eliminate adverse effects of the offset voltage due to process variations of the amplifiers inside the chip, and consequently to achieve a matched filter capable of providing correlation outputs with high precision. Moreover, since the operational reference voltage of the sample-hold circuit 10 can be externally determined, the mutual difference of operational reference voltages between the chips can be eliminated.

Figure 4:
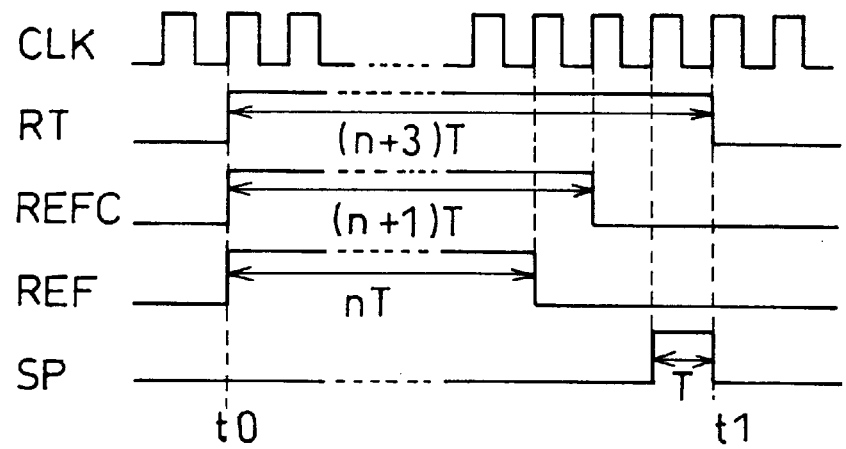
FIG. 4 is a timing chart indicating refresh-sample control of the sample-hold circuit of first embodiment of the present invention.

Here, FIG. 4 shows a control-timing chart of the switches 21 through 24 in the sample-hold circuit 10. A clock signal CLK, shown in FIG. 4, is an input clock for the matched filter, and its cycle T is set to be the same as the sampling cycle of the analog input signal, that is, the length of the chip-section width (Tc).

A signal REFC, shown in FIG. 4, is a signal for controlling the switch 22 and the switch 24, shown in FIG. 3. During the refreshing operation, when the signal REFC goes "H", the switch 22 is turned on. Thus, the input-side terminal of the input capacitor 25 of the sample-hold circuit 10 is set at the reference voltage Vref. When the signal REFC goes "H", the switch 24 is switched to the reference voltage Vref side, and the output-side terminal of the feedback capacitor 26 is set at the reference voltage Vref.

The signal REF, shown in FIG. 4, is a control signal for short-circuiting the input and output of the inverter 27. When REF goes "H", the switch 23 of FIG. 3 is turned on. When REF goes "L", the switch 23 of FIG. 3 is turned off. A signal SP, shown in FIG. 4, is a sampling signal. When SP goes "H", the switch 21 of FIG. 3 is turned on and the sample-hold circuit 10 becomes the sampling state. When SP goes "L", the switch 21 is turned off, and the sample-hold circuit 10 becomes the holding state. In the sample-hold circuit 10 during the holding operation state, the switches 21 through 23 are off, and the switch 24 is switched to the output side of the inverter 27.

As illustrated in FIG. 4, upon refreshing the sample-hold circuit 10, the signals REFC and REF go "H" at first. Thus, the switches 22 and 23 are first turned on, and the switch 24 is switched to the reference voltage Vref side. During this period, the input floating-gate electric potential of the inverter 27 is settled to Vref+Voff that have been externally given. As a result, the sample-hold circuit 10 operates centering on the reference voltage Vref in accordance with equation (5). By setting the number of the steps of the sample-hold circuit 10 to (n+3) steps plus the number m of the maximum operation taps of the matched filter, it becomes possible to maintain the refreshing period as long as a period n times the operational clock cycle Tc of the matched filter. Next, upon completion of the refreshing period, the switch 23 is turned off. Consequently, the reference voltage Vref of the sample-hold circuit 10 is determined. Then, the switch 22 is turned off with a delay of Tc, and the switch 24 is switched to the output side of the inverter 27. This delay makes it possible to completely compensate for offset voltage that the inverter inherently possesses due to process variations.

Next, the switch 21 is turned on with a delay of Tc from the cut-off of the switch 22 so that the sample-hold circuit 10 is brought to the sampling state. This delay is provided so as not to operate the switch 21 and the switch 22 at the same time.

If the switch 21 and the switch 22 are operated at the same time, there is a possibility of a period during which the input Vin and the reference voltage Vref are connected to each other. In this case, a current appears due to the difference of electric potentials between Vin and Vref. No problem would be raised if the reference voltage Vref was an optimal constant voltage source; however, in fact, a voltage drop occurs due to wiring and internal impedances. Such variations in the reference voltage Vref cause errors in compensation for the operational reference voltage with respect to the sample-hold circuits at the other steps during the refreshing operation. The input electric potential of the sample-hold circuit 10 is maintained at the reference voltage Vref immediately before the sample-hold circuit 10 has entered the sampling state. If the input electric potential immediately before the sampling state is not equal to the reference voltage, but is maintained at, for example, the minimum input electric potential of the amplifier, and if the input varies to the maximum input electric potential of the amplifier in the sampling state, the acquisition time of the input signal is maximized.

However, if the refreshing operation is carried out in accordance with the timing shown in FIG. 4, the maximum acquisition time for the input signal is reduced to as short as one-half because the input electric potential of the amplifier at the time immediately before the sampling state is set at the center electric potential (the reference electric potential) of the input signal, as compared with the case when no control is carried out with respect to the input electric potential of the amplifier at the time immediately before the sampling state. This makes it possible to reduce the acquisition time for the sample-hold circuit 10 and also to improve the operational frequency of the matched filter.

Moreover, the signal RT, shown in FIG. 4, indicates a period of the sampling state or the refreshing state, and the matched filter of the present embodiment utilizes only the output of the sample-hold circuit 10 during the period of "L" of the signal RT, that is, during the holding state thereof, so as to carry out correlation operations, as will be described later. As will be understood by the relationship of RT and SP of FIG. 4, the output of the sample-hold circuit 10 during the sampling operation is ineffective for correlation operations of the matched filter. Therefore, optimal correlation operations can be carried out without being affected by the settling output during the sampling state. Here, during the period of "H" of the signal RT, the output of the sample-hold circuit 10 is not utilized for correlation operations. Therefore, in accordance with the embodiment of the present invention, in order to provide a matched filter with m taps, the sample-hold circuits 10 of m steps that are kept in the holding state and the sample-hold circuits 10 of (n+3) steps that ensure the (n+3)·Tc period that is required for the refreshing and sampling operations, are required. Consequently, as a whole, the matched filter of the present embodiment is provided with the sample-hold circuits 10 of (m+n+3) steps.

In addition, the following numeric values are given as one example: Supposing that the frequency of the input clock CLK is 50 MHz with m=128 and n=5, the refresh rate (the length from the first refresh to the next refresh) is set at 2.72 $\mu$s and the time (n·Tc) required for the refresh was 100 ns. Here, in the case of the code length t=128, the length of bit section T=2.56 $\mu$s and the length of chip section Tc=20 ns were obtained.

Moreover, the above-mentioned matched filter is provided with an addition-related adder 7 to which all outputs to be added upon carrying out correlation operations among the outputs of the sample-hold circuits are inputted, a subtraction-related adder 7 to which all outputs to be subtracted are inputted, and a subtracter 9 that subtracts the outputs of the two adders 7 and 8 and outputs the result as a correlation output Z.

Figure 11:
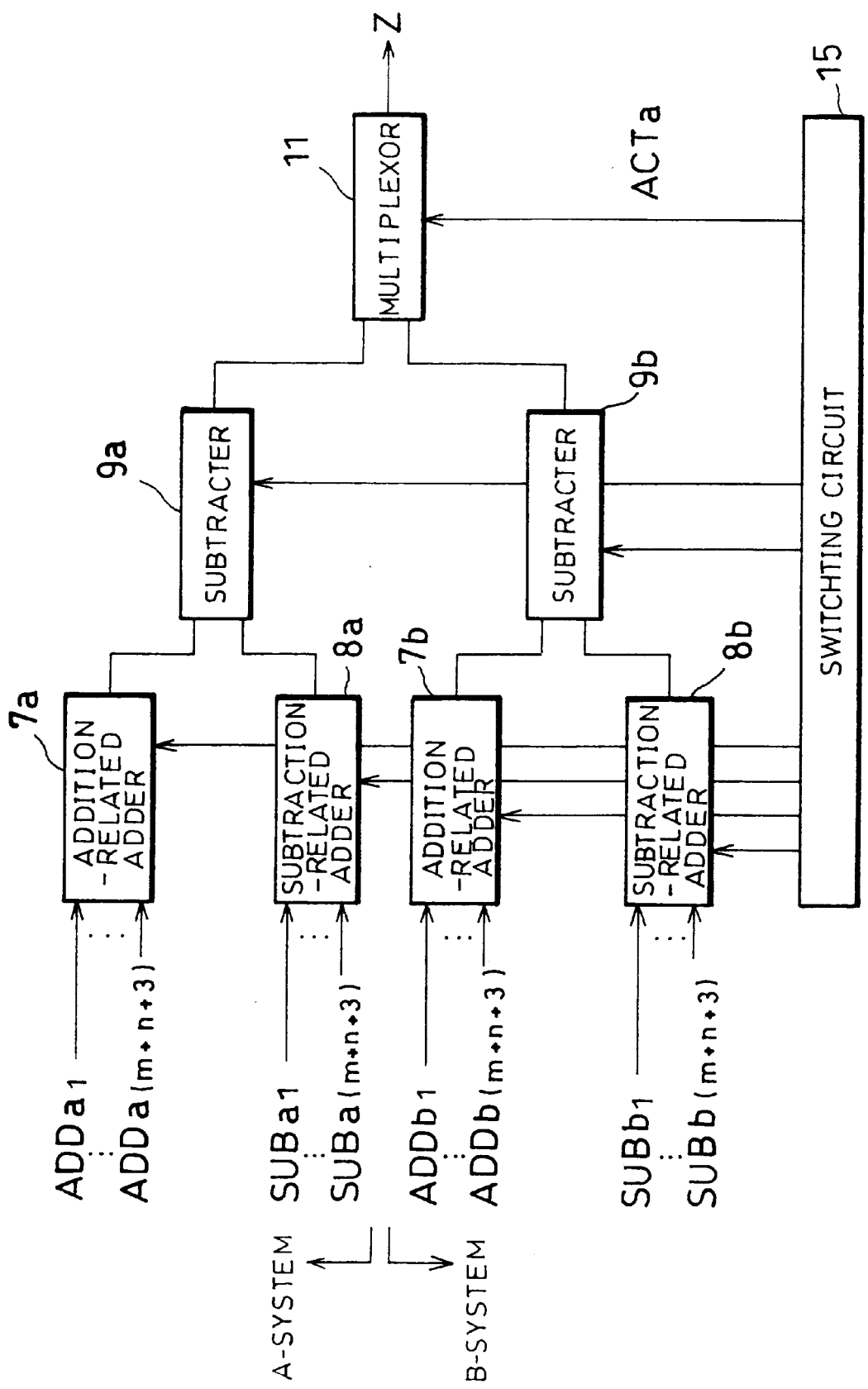
FIG. 11 is a block diagram showing connections among addition-related adders, subtraction-related adders and subtracters of the above-mentioned embodiment.

Here, if no refreshing operation is required, it is only necessary to provide one system including the addition-related adder 7 and the subtraction-related adder 8. However, since the operation output is suspended during the refreshing operation, the correlation output is adversely affected by the refreshing period when the two adders 7 and 8 require regular refreshing operations. Therefore, as illustrated in FIG. 11, in order to provide a method for refreshing without giving adverse effects on the correlation output, the matched filter of the present embodiment is provided with two systems A and B that respectively include addition-related adders 7a and 7b and subtraction-related adders 8a and 8b, each pair having the same construction. Then, in accordance with instructions from a switching circuit 15, refreshing operations of the A and B systems are alternately carried out in a time-sharing manner, and the output of the subtracter related to the system that has not been subject to the refreshing operation is selected by a multiplexor 11, and used as the correlation output. Here, for convenience of explanation, those components of the currently operating system are indicated by using the reference numerals 7, 8 and 9. Further, FIG. 1 only shows the construction of one of the systems for convenience of explanation.

Figure 6:
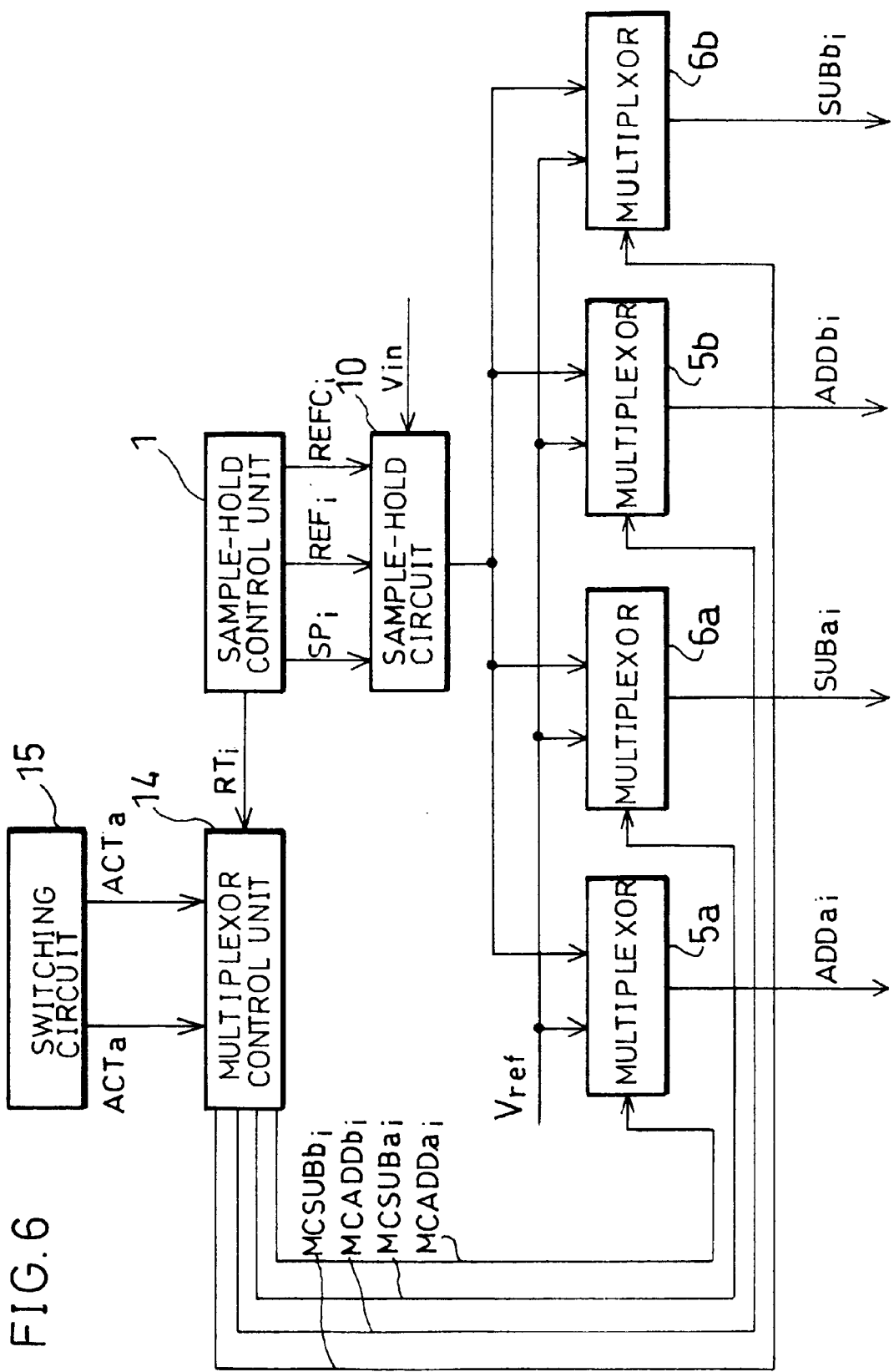
FIG. 6 is a block diagram showing the sample-hold circuit and the periphery of a multiplexor control system of the above-mentioned embodiment.

Further, as illustrated in FIG. 6, with respect to each sample-hold circuit 10, the matched filter of the present embodiment provides a sample-hold control unit 1 for successively instructing the refreshing, sampling and holding operations to the corresponding sample-hold circuit 10, addition-related product-operation multiplexors 5a and 5b that are placed between the output S of the sample-hold circuit 10 and the two addition-related adders 7a and 7b, subtraction-related product-operation multiplexors 6a and 6b that are placed between the output S and the two subtraction-related adders 8a and 8b, and a multiplexor control unit 14 for controlling the multiplexors 5a and 5b as well as 6a and 6b. Additionally, in the same manner as the adders 7 and 8 and other components, the multiplexors 5a, 5b, 6a and 6b are hereinafter indicated by reference numerals 5 and 6 in the case when the two systems are not specifically distinguished, for convenience for explanation. Further, FIG. 1 only shows one of the two systems.

As illustrated in FIG. 1, each of the multiplexors 5 and 6 is a multiplexor with two inputs, and one of the inputs is connected to the output S of the sample-hold circuit 10, while a predetermined reference voltage Vref is applied to the other input. Here, the reference voltage Vref is set at the same value as the operational reference voltage of each of the adders 7 and 8; therefore, when the multiplexor 5 or 6 selects the reference voltage Vref side, the output of the multiplexor 5 or 6 no longer gives effects on the results of correlation operations.

The respective sample-hold control units 1 and multiplexor control units 14 are connected in cascade, and the outputs of the two control units 1 and 14 at the last steps are connected to the inputs of the two control units 1 and 14 at the first steps. Thus, the internal states of the two control units 1 and 14 at a given step are allowed to cyclicly shift rightwards for each cycle Tc of the input clock CLK. As a result, control operations to the sample-hold circuit 10 and the multiplexors 5 and 6 at a given step are taken over by the succeeding steps for each cycle Tc. Moreover, in the case when only a given step is viewed, since the sample-hold circuits 10 of (m+n+3) steps are installed, the sample-hold circuit 10 and the multiplexors 5 and 6 at the corresponding step repeat the same operations with the cycle of (m+n+3) Tc.

Each multiplexor control unit 14 is provided with a D flipflop 2a for storing a correlation-operation filter coefficient p corresponding to the output S of the sample-hold circuit 10 at the corresponding step in the current cycle of the input clock CLK, a D flipflop 3a for storing an output-suppressing register value that indicates whether or not the output S contributes to correlation operations, a multiplexor control circuit 4 for generating control signals for the multiplexors 5 and 6 based on the outputs of the flipflops 2a and 3a. With respect to the relationship between the multiplexor control units 14, the output of the D flipflop 2a at a given step is connected to the input of the D flipflop 2a at the next step, and the output of the D flipflop 2a at the last step is connected to the input of the D flipflop 2a at the first step. These D flipflops 2a constitute a correlation-filter coefficient register 2 that has a length of (m+n+3) steps and that is allowed to shift its contents cyclicly for each input clock CLK. Moreover, the D flipflops 3a, which are connected in the same manner, constitute a sample-hold output-suppressing register 3.

Figure 5:
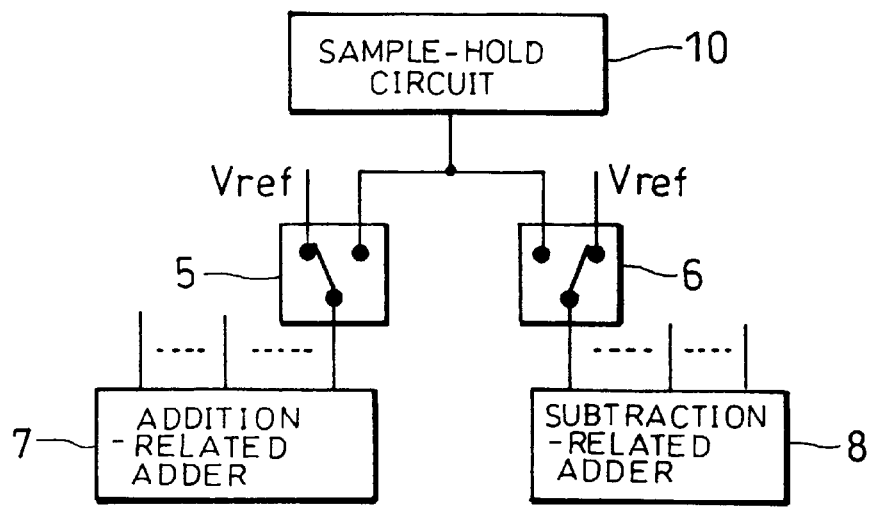
FIG. 5 is a block diagram showing connections between adders and the sample-hold circuit of the above-mentioned embodiment.

The multiplexor control circuit 4 at a given step allows the two multiplexors 5 and 6 to select the reference voltage Vref regardless of the output $MCQ_i$ of the correlation-filter coefficient register 2 at the corresponding step in the case of "0" of the output $RRQ_i$ of the sample-hold output-suppressing register 3 at the corresponding step. Thus, the output S of the corresponding step no longer give effects on the operation results of correlation operations. In contrast, in the case of "1" of the output $RRQ_i$, the multiplexor control circuit 4 allows the two multiplexors 5 and 6 to select either the output S or the reference voltage Vref based on the output $MCQ_i$. As a result, as illustrated in FIG. 5, the output S of the sample-hold circuit 10 is allocated to the addition-related adder 7 and the subtraction-related adder 8 based on the contents of the correlation-filter coefficient register 2 at the corresponding step.

The correlation filter coefficient sequence P(t) is stored in the correlation-filter coefficient register 2 corresponding to successive "t" number of steps in the correlation-filter coefficient register 2. Moreover, "1s" are stored in the same steps as the "t" number of steps in sample-hold output-suppressing register 3, and "0s" are stored in the rest of the steps. Thus, even in the case when the cycle t of the correlation filter coefficient sequence P(t) is less than the maximum tap number m, accurate correlation operations can be carried out by using only the sample-hold circuits 10 of "t" number of steps that contribute to the correlation operations.

Further, in the sample-hold control register 12 constituted by the sample-hold control units 1 of the (m+n+3) steps, successive "(n+3)" number of steps have "1s" stored therein, and the remaining "m" number of steps have "0s" stored therein. Therefore, the output $Q_i$ of the sample-hold control unit 1 at the i-numbered step varies with a cycle of (m+n+3)·Tc, and takes "0" during the period m·Tc, while taking "1" during the period (n+3)·Tc. The sample-hold control unit 1 at each step instructs the refreshing and sampling operations to the corresponding sample-hold circuit 10 during the period (n+3)·Tc, and also instructs the holding operation during the period m·Tc, based on the output $Q_i$, etc., at the corresponding step.

Therefore, the analog signal Vin at a given time is acquired by the same sample-hold circuit 10 during the period m·Tc, and is subjected to a correlation operation with the correlation filter coefficient sequence P(t) that has been shifted by one position, each time a new input clock CLK is inputted thereto. Here, in the case when the cycle t of the correlation filter coefficient sequence P(t) is less than the maximum tap number m, the outputs of the sample-hold circuits 10 of "(m−t)" number of steps are controlled by the sample-hold output-suppressing register 3, so as not to contribute to the correlation operations.

Referring to an example shown in Table 1, the following description will discuss the relationship between factors including the internal states of the sample-hold control units 1 and the contents of the registers 2 and 3 and other factors including the states of the sample-hold circuits 10 and the controlling operations of the multiplexors 5 and 6 at a given time. Supposing that the cycle t of the correlation-filter coefficient sequence P(t) is 7 and that the refreshing period is twice as long as the spread cycle Tc, it is adequate to set the number of the matched filter at 12 steps (7+2+3=12). In this example, however, an explanation will be given of a case wherein correlation operations with 7 taps are carried out by using matched filters of 16 steps. For convenience of explanation, Table 1 shows a matched filter in which the maximum tap number m=11 and the constant n indicating the refreshing period is set at 2, that is, a matched filter having the sample-hold circuits 10 of 16 steps. In this case, Table 1 indicates the time when the sample-hold circuits 10 from the first tap to the seventh tap are allowed to contribute to correlation operations with a cycle t=7 of the correlation filter coefficient sequence P(t). Here, in Table 1, with respect to the states of the sample-hold circuits 10, the holding state, sampling state and refreshing state are abbreviated as "H", "S" and "R" respectively. Further, in Table 1, the multiplexors 5 and 6 are designated by "Vr" when they are specified to select the reference voltage Vref, and also designated by "sn" (n: the number of taps) when they select the outputs of the sample-hold circuits 10. In addition, upon referring to the contents of the correlation-filter coefficient register 2, pn represents the code corresponding to the n-numbered bit of the binary spread codes that have been used in a spreading process. Further, "a" represents any given code.

TABLE 1

| Tap Number | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| Contents of Sample-Hold Control Register | 0 | 0 | 1 | 1 | 1 | 1 | 1 | 0 | 0 | 0 | 0 | 0 | 0 | 0 | 0 | 0 |
| States of Sample-Hold Circuits | H | H | H | H | H | H | H | S | H | H | R | R | H | H | H | H |
| Cont. of Multiplexor by Sample-Hold Control Register | s1 | s2 | s3 | s4 | s5 | s6 | s7 | Vr | Vr | Vr | Vr | Vr | s13 | s14 | s15 | s16 |
| Contents of Sample-Hold Output Suppressing Register | 1 | 1 | 1 | 1 | 1 | 1 | 1 | 0 | 0 | 0 | 0 | 0 | 0 | 0 | 0 | 0 |
| Cont. of Multiplexor by Sample-Hold Suppressing Register | s1 | s2 | s3 | s4 | s5 | s6 | s7 | Vr | Vr | Vr | Vr | Vr | Vr | Vr | Vr | Vr |
| Contents of Correlation Filter Coefficient Register | p1 | p2 | p3 | p4 | p5 | p6 | p7 | a | a | a | a | a | a | a | a | a |

The matched filter, shown in Table 1, has extra sample-hold circuits 10 of n+3=5 steps; therefore, the sample-hold control register 12 constituted by the sample-hold control units 1 have their third to seventh steps, that is, five steps, set at "1", and have their rest of steps all set at "0".

Based upon the values of the sample-hold control register 12, each sample-hold control unit 1 instructs the refreshing and sampling operations, five steps earlier than the output of the sample-hold control unit 1 at the corresponding step becomes "1". With this arrangement, the sample-hold circuits from the 8th to the 12th steps enter the sampling or refreshing state. More specifically, the sample-hold circuits 10 at the 12th and 11th steps are allowed to enter the refreshing state, and the sample-hold circuit 10 at the eighth step is allowed to enter the sampling state. Further, the sample-hold circuits 10 at the ninth and tenth steps are in a transit state between the two states, with the switches 21 and 24 shown FIG. 3 having been switched as described earlier.

Moreover, as indicated by eighth through 12th steps in Table 1, upon instructing the refreshing or sampling operation, each sample-hold control unit 1 gives instructions to the corresponding multiplexor control unit 14 so as to make the multiplexors 5 and 6 select the reference voltage Vref. The multiplexors 5 and 6 at these steps output the reference voltage Vref. As a result, during the refreshing and sampling operations, the corresponding sample-hold circuits 10, that is, the sample-hold circuits of five steps corresponding to eighth through 12th steps have their outputs to become ineffective for correlation operations by the sample-hold control register 12. The contents of the correlation-filter coefficient register 2 corresponding to these steps are allowed to take either "1" or "0".

Although the ineffective position is shifted one step by one step each time the input clock CLK is inputted, the outputs of the sample-hold circuits 10 of five steps from the refreshing state to the sampling state are controlled so as to be ineffective for correlation operations. Therefore, in the case of the matched filter shown in the example of Table 1, the rest of the sample-hold circuits 10 of eleven steps makes it possible to perform correlation operations with a maximum of 11 taps. Here, sn in Table 1 refers to the output of the sample-hold circuit 10 at the n-numbered step.

On the other hand, in the current cycle of the input clock CLK, the sample-hold control units 1 at the first to seventh steps as well as the 13th to 16th steps instruct the holding operation to the sample-hold circuits 10 at these steps. Therefore, if controlled only by the instructions from the sample-hold control units 1, the multiplexors 5 and 6 at these steps release the output Sn of the sample-hold circuits 10. This makes it possible to perform correlation operations with a maximum of 11 taps depending on the setting of the sample-hold suppressing register 3.

Further, in order to make the seven steps effective, the contents of the sample-hold output-suppressing register 3 are set at positions so that the steps that have been made ineffective by the sample-hold control register 12 and the steps that are made effective by the sample-hold output-suppressing register 3 do not overlap each other; that is, the first through 7th steps take "1" and all the remaining steps take "0". Moreover, at the steps wherein the sample-hold output-suppressing register 3 is set at "0", that is, the eighth to 16th steps, the respective multiplexors 5 and 6 release the reference voltage Vref. At the steps wherein they are set at "1", that is, the first to seventh steps, the multiplexors 5 and 6, on the other hand, release outputs s1 through s7 of the sample-hold circuits 10. Correlation operations are carried out between the outputs s1 through s7 and the values p1 through p7 of the correlation-filter coefficient register 2 at the corresponding steps.

Moreover, in the correlation-filter coefficient register 2, the steps, which correspond to the sample-hold circuits at the steps in the holding state that are effective for operations, are set in accordance with the respective binary spread codes. In other words, the last factor p7 of the spread code sequence P(t) is allowed to enter the righthand step closest to the step containing "1" from the sample-hold output-suppressing register 3 and the remaining factors are stored in the corresponding steps containing "1" in succession.

In the case when the contents of the respective registers 12, 2 and 3 are set as shown in FIG. 1, a matched filter with 7 taps is achieved. Additionally, depending on the setting of the sample-hold output-suppressing register 3, the matched filter is allowed to carry out correlation operations with a desired length of the number of taps, as long as the number of taps is not more than 11 taps.

A detailed explanation will be given below of the circuit constructions and operations of the respective parts in the above-mentioned matched filter. FIG. 6 shows the sample-hold circuit 10 at a given step and its peripheral digital control system. In other words, the sample-hold circuit 10 receives refresh signals $REF_i$ and $REFC_i$ from the sample-hold control unit 1 at the corresponding step, and dynamically compensates for variations of the offset voltage. Further, it receives a sample signal $SP_i$, and samples and holds the analog input signal Vin.

Here, the output of the sample-hold circuit 10 is applied to the addition-related product-operation multiplexors 5a and 5b of the a-system and b-system as well as to the subtraction-related product-operation multiplexors 6a and 6b of the a-system and b-system. The respective multiplexors 5a, 5b, 6a and 6b select and output the output Si of the sample-hold circuit 10 upon receipt of "1" of control signals $MCADDa_i$, $MCADDb_i$, $MCSUBa_i$ and $MCSUBb_i$ from the multiplexor control unit 14, and also select and output the reference voltage Vref upon receipt of "0" thereof. Thus, the output $S_i$ of the sample-hold circuit 10 is allocated to the succeeding steps of the multiplexors 5a, 5b, 6a and 6b, that is, the addition-related and subtraction-related adders 7a, 7b, 8a and 8b, shown in FIG. 11.

However, when the sample-hold circuit 10 is in the sampling state or refreshing state, the sample-hold control unit 1 releases a control signal $RT_i$ to the multiplexor control unit 14 so as to forcefully set at "0" the control signal $MCADDa_i$, $MCADDb_i$, $MCSUBa_i$ and $MCSUBb_i$ be inputted to the multiplexors 5a, 5b, 6a and 6b. In this case, all the multiplexors 5a, 6a and 6b select the reference voltage Vref. As a result, even in the case when unwanted variations occur in the output of the sample-hold circuit 10 at the corresponding step due to the refreshing and sampling operations, it is possible to suppress variations in correlation operations. Moreover, in this state, the output of the sample-hold circuit 10 is cut off from the adders 7a, 7b, 8a and 8b (see FIG. 11) at the succeeding steps by the multiplexors 5a, 5b, 6a and 6b. Therefore, the output load of the sample-hold circuit 10 is reduced by the loads corresponding to wiring loads from the multiplexors 5a, 5b, 6a and 6b to the adders 7a, 7b, 8a and 8b and input capacitive loads of the adders 7a. Consequently, it becomes possible to shorten the time required for input acquisition of the sample-hold circuit 10 during the sampling operation state.

Figure 7:
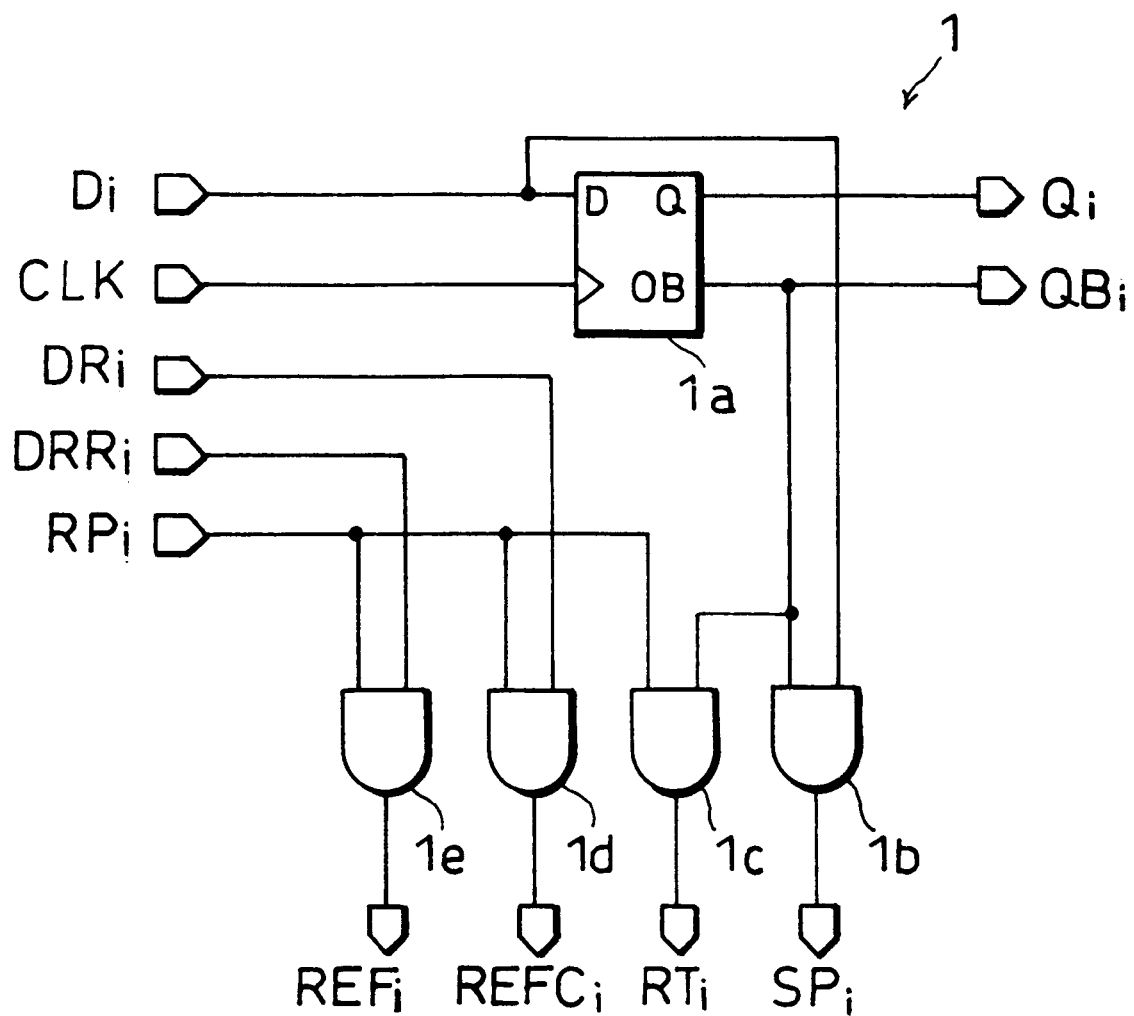
FIG. 7 is a circuit diagram showing a sample-hold control unit in accordance with the above-mentioned embodiment.

Here, a detailed explanation will be given of structural examples of the sample-hold control unit 1 and multiplexor control unit 14 shown in FIG. 6. As illustrated in FIG. 7, the sample-hold control unit 1 at the i-numbered step is provided with a D flipflop 1a which holds the output $Q_{i-1}$ of the sample-hold control unit 1 at the preceding step that has been applied thereto as an input $D_i$ during the presence of the input clock CLK, and AND circuits 1b, 1c, 1d and 1e with two inputs, which generate the control signals $SP_i$, $RT_i$, $REFC_i$ and $REF_i$ based on the output $Q_i$ and inversion output $QB_i$ of the corresponding D flipflop 1a and the input signals $DR_i$, $DRR_i$ and $RP_i$ that are given from the sample-hold control units 1 at other steps.

More specifically, the AND circuit 1b, which outputs the control signal $SP_i$, has one of the inputs connected to the input $D_i$ and the other input connected to the inversion output $QB_i$ of the D flipflop 1a. Further, the AND circuit 1c, which releases the control signal $RT_i$, carries out the logical AND between the inversion output $QB_i$ of the D flipflop 1a and the input signal $RP_i$. Moreover, the AND circuit 1d outputs the logical AND of the two input signals $RP_i$ and $DR_i$ as the control signal $REFC_i$, and the AND circuit 1e outputs the logical AND of the two inputs $RP_i$ and $DRR_i$ as the control signal $REF_i$.

Figure 8:
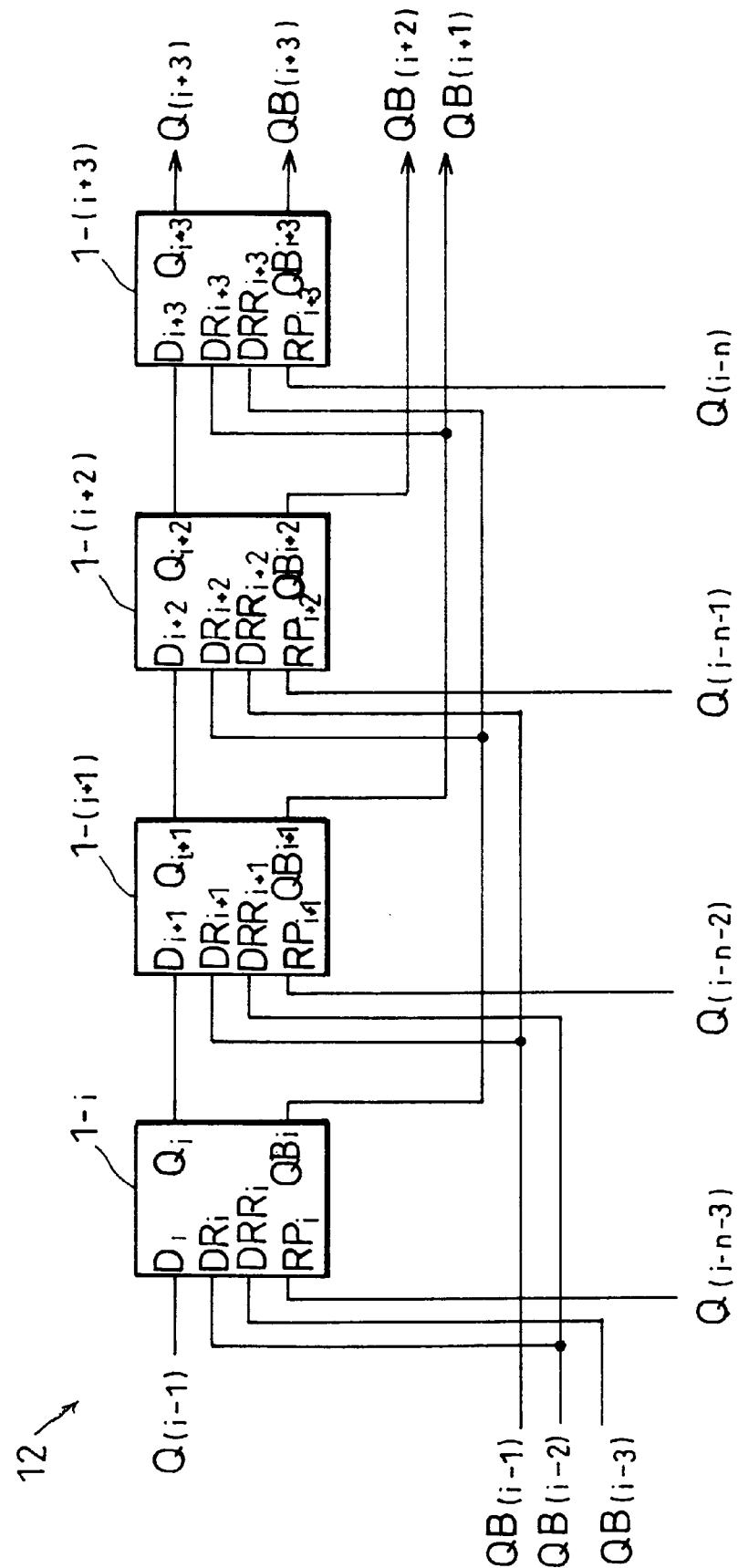
FIG. 8 is a circuit diagram showing a sample-hold control register in accordance with the above-mentioned embodiment.

Furthermore, the sample-hold control units 1 are connected as shown in FIG. 8, and the inversion output $QB_{i-2}$ of the sample-hold control unit $1_{i-2}$ located two steps before is applied to the input $DR_i$. Further, the inversion output $QB_{i-3}$ of the sample-hold control unit $1_{i-3}$ located three steps before is applied to the input $DRR_i$, and the output $Q_{i-n-3}$ of the sample-hold control unit $1_{(i-n-3)}$ located (n+3) steps before is supplied to the input $RP_i$. Here, although the input clock CLK is applied to the sample-hold control units 1, the input clock CLK is omitted in FIG. 8 because it is not related to the connections between the sample-hold control units 1. Similarly, the control signals $REF_i$, $REFC_i$, $SP_i$ and $RT_i$, released by the sample-hold control units 1, are also omitted.

As described earlier, the values of the D flipflops 1a are arranged to go "H" level successively by the number of extra sample-hold circuits 10, that is, the number (n+3). With this arrangement, the sample-hold control unit 1 at the i-numbered step allows the control signal $SP_i$ to go "H" from the time when the output $Q_{i-1}$ ($D_i$) of the D flipflop 1a at the preceding step has become "H" level until the time when the output $Q_i$ of the D flipflop 1a at the corresponding step becomes "H" level. As a result, supposing that the time when the output $Q_i$ of the corresponding step becomes "H" level is t1, the control signal $SP_i$ goes "H" level during the period between Tc up to the time t1.

Moreover, the control signals $RT_i$, $REFC_i$, $REF_i$ are allowed to rise at the time when the input signal $RP_i$ has become "H" level, that is, the time when the output $Q_{(i-n-3)}$ of the D flipflop 1a located n+3 steps before has become "H", and respectively maintain the "H" level state until the output $Q_i$ of the corresponding step, the output $Q_{i-1}$ located one step before and the output $Q_{i-2}$ located two steps before become "H" level. Thus, the control signal $RT_i$ is allowed to go "H" level during the period of (n+3)·Tc from the time t0 that is (n+3)·Tc before the time t1. Similarly, the control signal $REFC_i$ is allowed to go "H" level during the period of (n+1)·Tc from the time t0, and the control signal $REF_i$ is allowed to go "H" level during the period of n·Tc from the time t0.

The value, held by each flipflop 1a, is taken over by the succeeding step each time the input clock CLK is inputted. Therefore, the sample-hold control units 1 at the respective steps generate the control signals RT, REFC, REF and SP in synchronized timing with a delay of one-clock cycle Tc from the preceding step. Consequently, the sample-hold circuits 10 sample the analog signal Vin at the time shifted by one-clock cycle Tc for each step, and hold the sampled values during the period of m·Tc.

Here, as shown in FIG. 6, in addition to the above-mentioned inputs $MCD_i$ and $RRD_i$ from the multiplexor control unit 14 at the preceding step, the control signal $RT_i$ is applied to the multiplexor control unit 14 of the present embodiment from the sample-hold control unit 1 at the corresponding step. Further, the switching circuit 15 applies switching control signals ACTa and ACTb that indicate which system of the two systems is related to the currently operating adders 7 and 8 to each multiplexor control unit 14.

Here, the switching circuit 15 normally generates the ACTa that is an inversion signal of the ACTb.

Figure 9:
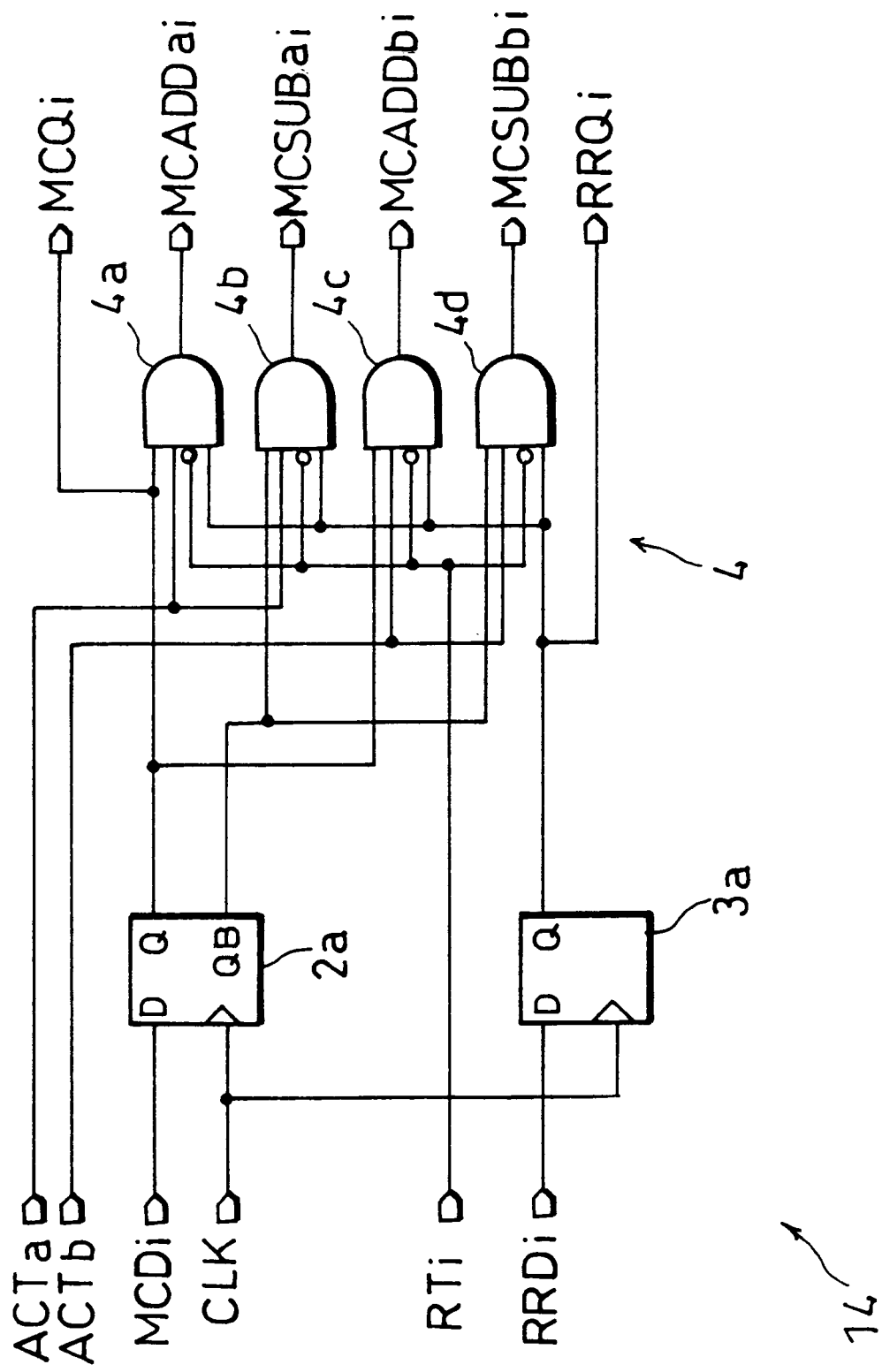
FIG. 9 is a circuit diagram showing a multiplexor control unit in accordance with the above-mentioned embodiment.

In accordance with these input signals, each multiplexor control unit 14 applies control signals $MCADDa_i$, $MCADDb_i$, $MCSUBa_i$ and $MCSUBb_i$ to the multiplexors 5a, 5b, 6a and 6b of the two systems respectively. More specifically, each multiplexor control unit 14 is provided with the D flipflops 2a and 3a and the multiplexor control circuit 4; and as shown in FIG. 9, the multiplexor control circuit 4 of the present embodiment is constituted by AND circuits 4a, 4b, 4c and 4d that output the respective control signals $MCADDa_i$, $MCADDb_i$, $MCSUBa_i$ and $MCSUBb_i$. Each of the AND circuits 4a through 4d is an AND circuit with four inputs, and carries out a logical AND of the four inputs. Here, only the third input is subjected to a logical NOT, and then subjected to a logical AND. The control signal ACTa is applied to the first inputs of the AND circuits 4a and 4b that control the multiplexors 5a and 6a of the two multiplexors of the a-system. On the other hand, the control signal ACTb is applied to the first inputs of the AND circuits 4c and 4d that control the multiplexors 5b and 6b of the two multiplexors of the b-system. Similarly, the second inputs of the AND circuits 4a and 4c that control the two multiplexors 5a and 5b of the adder system are connected to the output Q of the D flipflop 2a that constitutes the correlation-filter coefficient register 2; and the second inputs of the AND circuits 4b and 4d that control the two multiplexors 6a and 6b of the subtracter system are connected to the inversion output QB of the D flipflop 2a. Further, the output signal RRQi, which is released from the D flipflop 3a constituting the sample-hold output-suppressing register 3, is connected to the third inputs of the AND circuits 4a through 4d. Moreover, the control signal RTi from the sample-hold control unit 1 at the corresponding step shown in FIG. 6 is inputted to the fourth inputs of the AND circuits 4a through 4d.

The multiplexor control circuit 4, which is constituted by the AND circuits 4a through 4d that are logical circuits, is assembled so as to provide the following four functions:

First, the multiplexor control circuit 4 carries out a product-operation function using binary correlation-filter coefficients. When the D flipflop 2a, which stores the binary correlation-filter coefficient, is "1", the control signal of the multiplexors 5a and 5b for selecting the inputs of the addition-related adders becomes "1", thereby allowing the output s of the sample-hold circuit 10 to become the input of the addition-related adders 7a and 7b. Further, when the D flipflop 2a, which stores the binary correlation-filter coefficient, is "1", the control signal of the multiplexors 6a and 6b for selecting the inputs of the subtraction-related adders 8a and 8b becomes "0", thereby allowing the reference voltage Vref to become the input of the subtraction-related adder 8.

In contrast, when the D flipflop 2a, which stores the binary correlation-filter coefficient, is "0", the control signal to be sent to the multiplexors 5a and 5b for selecting the inputs of the addition-related adders 7a and 7b becomes "0", thereby allowing the reference voltage Vref to become the input of the addition-related adders 7a and 7b. Further, when the D flipflop 2a, which stores the binary correlation-filter coefficient, is "0", the control signal to be sent to the multiplexors 6a and 6b for selecting the inputs of the subtraction-related adders 8a and 8b becomes "1", thereby allowing the output s of the sample-hold circuit 10 to become the input of the subtraction-related adders 8a and 8b.

Such control of the multiplexors provides the following function. To the addition-related adders 7a and 7b are inputted the outputs of the sample-hold circuits 10 corresponding to the steps at which the D flipflops 2a, which store the binary correlation-filter coefficients, indicate "1" and the operational reference voltage corresponding to the steps at which the D flipflops 2a, which store the binary correlation-filter coefficients, indicate "0". Since the adders are operated centered on the operational reference voltage, the addition-related adders 7a and 7b only add the outputs of the sample-hold circuits 10 at the steps having the symbol "1".

In contrast, to the subtraction-related adders 8a and 8b are inputted the outputs of the sample-hold circuits 10 corresponding to the steps having "0" of the binary correlation-filter coefficient and the reference voltage Vref corresponding to the steps at which the D flipflops 2a, which store the binary correlation-filter coefficients, indicate "1". Similarly, since the adders are operated centered on the operational reference voltage, the subtraction-related adders 8a and 8b only add the outputs of the sample-hold circuits 10 at the steps having the symbol "0". Finally, the outputs of the subtracters 9a and 9b that subtract the outputs of the subtraction-related adders 8a and 8b from the outputs of the addition-related adders 7a and 7b serve as correlation outputs of the matched filter. With respect to the correlation outputs, in the steps at which the D flipflops 2a, which store the binary correlation-filter coefficients, indicate "1", the function of adding the outputs of the sample-hold circuits 10 at the corresponding steps is provided, and in the steps at which the D flipflops 2a, which store the binary correlation-filter coefficients, indicate "0", the function of subtracting the outputs of the sample-hold circuits 10 at the corresponding steps is provided.

Secondly, the multiplexor control circuit 4 of FIG. 9 has the function of determining the input electric potentials during the refresh operation of the adders 7a, 8a, 7b and 8b of the two systems a and b, which are installed at the succeeding steps of the multiplexors 5a, 5b, 6a and 6b of FIG. 6.

FIG. 11 shows the connecting construction of the addition-related adders 7a and 7b, the subtraction-related adders 8a and 8b, the subtraction-related adders 9a and 9b as well as the multiplexor 11 and the switching circuit 15, which are installed as the two systems a and b following the multiplexors 5a, 5b, 6a and 6b of FIG. 6. More specifically, in the a-system, the output of the addition-related adder 7a and the output of the subtraction-related adder 8a are inputted to the subtracter 9a of the a-system. Similarly, in the b-system, the outputs of the two adders 7a and 8b are inputted to the subtracter 9b. Moreover, the outputs of the subtracters 9a and 9b of the two systems are connected to the multiplexor 11.

Here, the multiplexor 11, upon receipt of "High" level of the control signal ACTa from the switching circuit 15, selects the subtracter 9a side, and upon receipt of "Low" level thereof, selects the subtracter 9b side. Consequently, whichever system of the a and b systems is being operated, the matched filter is allowed to continuously output correlation outputs that have been calculated by using the system in operation. Moreover, the switching circuit 15 outputs the control signals REFa and REFCa for indicating the refresh timing of the a-system to the respective circuits 7a, 8a and 9a, and outputs the control signals REFb and REFCb for indicating the refresh timing of the b-system to the respective circuits 7a, 8b and 9b.

Figure 12:
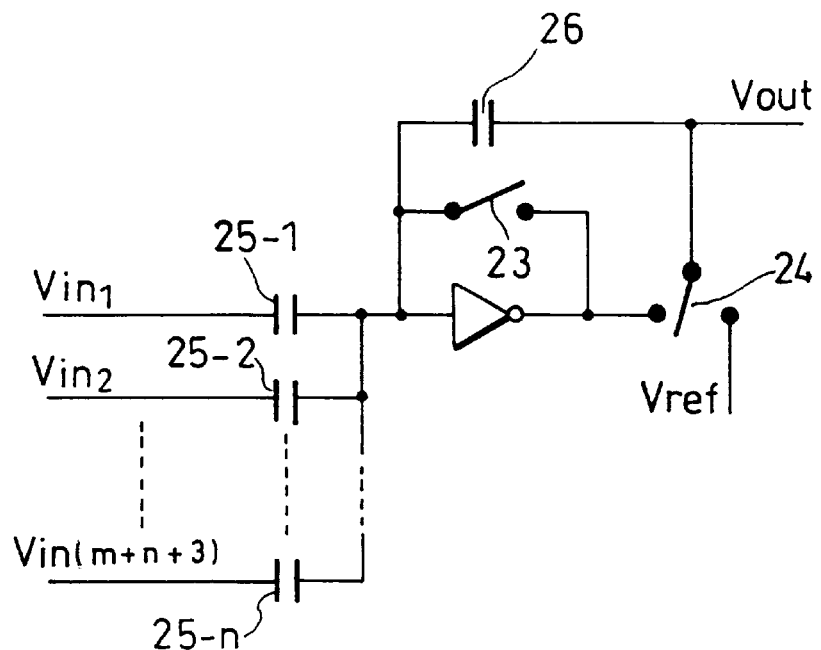
FIG. 12 is a circuit diagram showing each adder of the above-mentioned embodiment.

Referring to FIG. 12, the following description will explain the construction of the addition-related adder 7a (7b) and the subtraction-related adder 8a (8b). These adders 7a, 8a (7b, 8b) are virtually the same as the sample-hold circuits 10 shown in FIG. 3; however, the switches 21 and 22, shown in FIG. 2, are omitted, and a plurality of input capacitors $25_1, \ldots, 25_2, \ldots, 25_{(m+n+3)}$ are installed in relation to a plurality of input signals $Vin_1, Vin_2, \ldots, Vin_{(m+n+3)}$. Here, since the other construction is the same as that shown in FIG. 3, those components that have the same functions are indicated by the same reference numerals and the description thereof is omitted.

In these adders 7a, 8a (7b, 8b) the switch 23 is closed when the control signal REFa (REFb) goes "High", and is cut off when the signal goes "Low". Further, the switch 24 selects the reference voltage Vref side when the control signal REFCa (REFCb) goes "High", and selects the output side of the inverter 27 when the signal goes "Low".

Here, during the refreshing operation, it is necessary to control all the inputs $Vin_1$ through $Vin_{(m+n+3)}$ to be set at the reference voltage Vref, in the same manner as the offset-compensating principle of the sample-hold circuits in FIG. 3. In order to provide such control, the control signals ACTa and ACTb are inputted to the multiplexor control units 14 of FIG. 9. The signals ACTa and ACTb are normally provided as inversion signals. When the control signal ACTa is "0", the multiplexor control signals MCADDa and MCSUBa of the a-system become "0", thereby allowing the corresponding multiplexors to output the reference voltage Vref. Similarly, in the case of "0" of ACTb, the multiplexors of the b-system output the reference voltage Vref. By inputting the control signals ACTa and ACTb to all the multiplexor control units 14, it becomes possible to make the inputs of the adders also alternately set at the reference voltage Vref, and consequently to carry out the offset compensation in accordance with the present invention.

Figure 13:
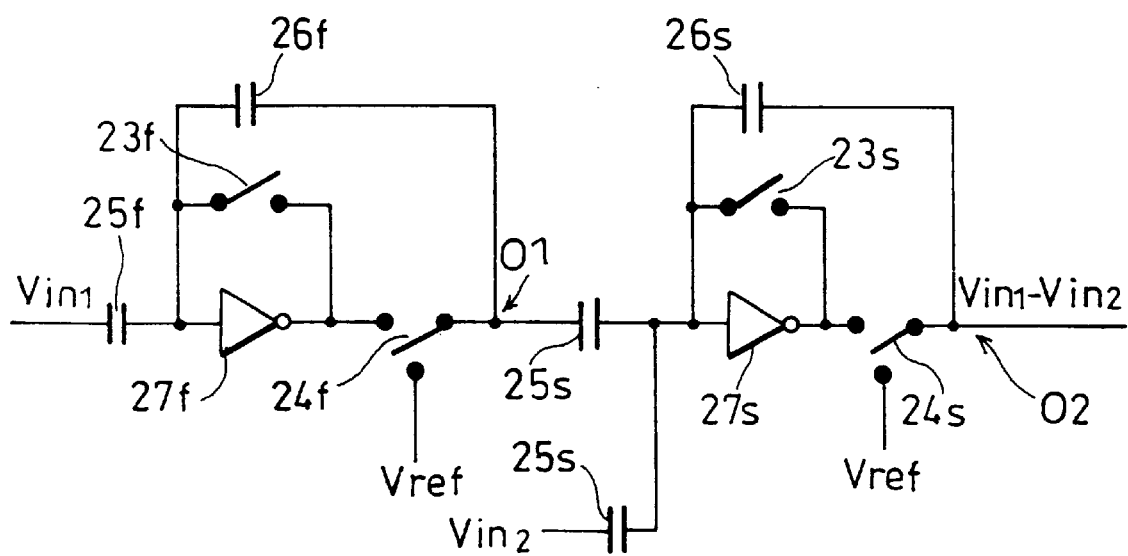
FIG. 13 is a circuit diagram showing each subtracter of the above-mentioned embodiment.

Moreover, as illustrated in FIG. 13, each subtracter 9a (9b) is constructed by connecting two steps of the same circuits as shown in FIG. 12 in cascade. Here, the output Vin, of the addition-related adder 7a (7b) of FIG. 12 is applied to the first step, and the output of the first step and the output $Vin_2$ of the subtraction-related adder 8a (8b) of FIG. 12 are applied to the second step. In order to differentiate the component at the first step and that at the second step, the component related to the first step is referred to by adding "f" to the reference numeral, and the component related to the second step is referred to by adding "s" thereto.

In the subtracter 9a (9b), the two switches 23f and 23s are made to conduct when the control signal REFa (REFb) goes "High", and are cut off when the signal goes "Low". Further, in the case of "H" level of the control signal REFCa (REFCb), the two switches 24f and 24s select the reference voltage Vref side, and in the case of "L" level thereof, they select the output side of the inverter 27.

Here, during the refreshing operation of the subtracter 9a (9b), in the same manner as the offset-compensating principle of the sample-hold circuit of FIG. 3, electric potentials of the following ends need to be set at the reference voltage Vref respectively; that is, the input $Vin_1$ from the addition-related adder 7a (7b), the input $Vin_2$ from the subtraction-related adder 8a (8b), as well as the node O1 on the proceeding-step side of the input capacitor $25s_1$ at the succeeding step and the node O2 on the succeeding-step side of the feedback capacitor 26s. As illustrated in FIG. 11, since the adders 7a (7b) and 8a (8b) are installed at the proceeding steps of the subtracter 9a (9b), it is only necessary to set the switch 24 of FIG. 12 and the switches 24f and 24s of FIG. 13 at the reference voltage Vref side during the refreshing operation.

Figure 14:
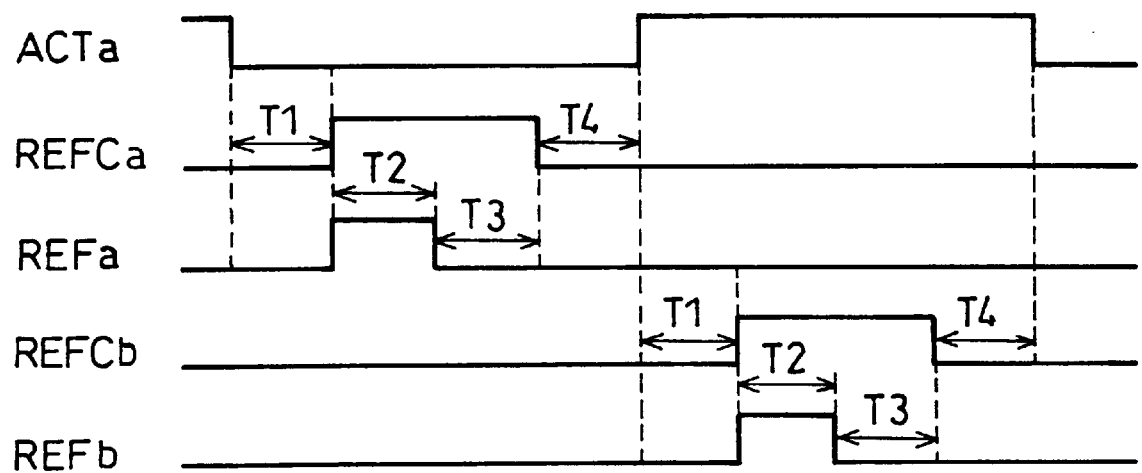
FIG. 14 is a timing chart indicating refresh control of the adders and the subtracters.

In this case, the switching circuit 15, shown in FIG. 11, generates the control signals REFa, REFca (REFb, REFcb)

in the timing as shown in FIG. 14. In other words, the switching circuit 15 allows the control signals REFCa and REFa to rise after a predetermined delay time T1 has elapsed since a fall of the control signal ACTa, and holds them at "H" level until a predetermined time T2 has elapsed. The time T2 is set to be long enough to release charges that have been accumulated in the input terminals of the inverters 27, 27f and 27s shown in FIGS. 12 and 13. When the time T2 has elapsed, the switching circuit 15 allows the control signal REFa to fall. The control signal REFCa is, on the other hand, held at "H" level until a delay time T3 has further elapsed since the fall of the control signal REFa. Moreover, the switching circuit 15 allows the control signal ACTa to rise after a point time T4 has elapsed since the fall of the control signal REFCa. Here, the control signals REFb and REFCb are generated in the same manner except that "H" and "L" are reversed in the control signal ACTa.

In the above-mentioned timing, since the delay time T1 is provided, even in the event of a jitter in the refresh signals REFa, REFCa (REFb and REFCb) or the control signal ACTa, the control signal ACTa is positively allowed to vary prior to the time of the rise of the refresh signals REFa, REFCa (REFb and REFCb). Similarly, since the delay time T4 is provided, the control signal ACTa is positively allowed to vary after the time of the fall of the refresh signals REFa, REFCa (REFb and REFCb). Consequently, upon switching the multiplexor 11 shown in FIG. 11, the output of the subtracter 9 of the system under the refreshing operation is not released from the multiplexor 11. As a result, it becomes possible to prevent noise due to the corresponding output, and consequently to further improve the operation precision of the matched filter. Moreover, in the same manner as the sample-hold circuit 10, the delay time T3 makes it possible to provide a complete offset-compensating effect. Thus, the operation precision is further improved.

Thirdly, the multiplexor control circuits 4 of FIG. 9 produce the effect of making the outputs of the sample-hold circuits 10 ineffective for correlation operations during the refreshing or sampling process shown in FIG. 6, and also have the effect of reducing the load of the sample-hold circuits 10 during the sampling process so as to shorten the acquisition time. When the RT signal is "1", the sample-hold circuits 10 during the refreshing and sampling operations and the multiplexors 5a, 5b, 6a and 6b at the corresponding steps are controlled to select the reference voltage Vref as their outputs. This controlling process prevents the outputs of the sample-hold circuits 10 during the refreshing and sampling operations from being inputted to the adders 7a, 7b, 8a and 8b shown in FIG. 11, and, instead, allows the reference voltage Vref to be inputted to the adders 7a, 7b, 8a and 8b. Further, as described earlier, during the sampling operation, the signal RT is set at "1" so that the multiplexors 5a, 5b, 6a and 6b separate the sample-hold circuits 10 from the adders 7a, 7b, 8a and 8b shown in FIG. 11. Therefore, during the sampling operation, the sample-hold circuits 10 have a reduced input load, and are allowed to carry out the acquisition of the input signals at high speeds.

Fourthly, the multiplexor control circuits 4 of FIG. 9 produce the effect of enabling operations related to binary correlation-filter coefficients having a desired length. When the D flipflops 3a, used for suppressing the sample-hold outputs, are "0", multiplexor control outputs MCADDai, MCSUBai, MCADDbi and MCSUBbi are all set at "0". Therefore, the multiplexors 5a, 5b, 6a and 6b at the corresponding steps of FIG. 6 output the reference voltage Vref to the adders 7a, 7b, 8a and 8b. In other words, when the D flipflops 3a, used for suppressing the sample-hold outputs, are "0", the inputs of the adders at the corresponding steps are made ineffective for correlation operations.

Figure 10:
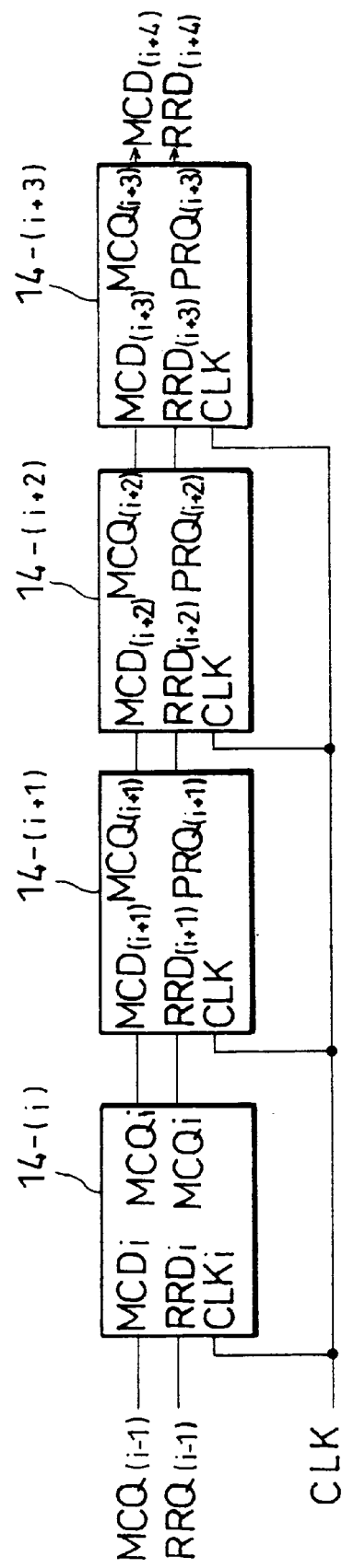
FIG. 10 is a circuit diagram showing connections between the respective multiplexor control units.

The multiplexor control units 14 of FIG. 9 are connected in cascade as shown in FIG. 10. Further, a common input clock CLK is inputted thereto. As illustrated in FIG. 1, the multiplexor control units 14 of (m+n+3) steps are aligned into a construction wherein the contents of the registers are allowed to shift cyclicly. Here, in FIG. 10, the inputs ACTa and ACTb are omitted because they are commonly applied to all the steps. Moreover, the input RTi, output MCADDai, MCSUBai, MCADDbi, MCSUBbi are omitted because they have nothing to do with the mutual connection between the multiplexor control units 14.

Figure 15:
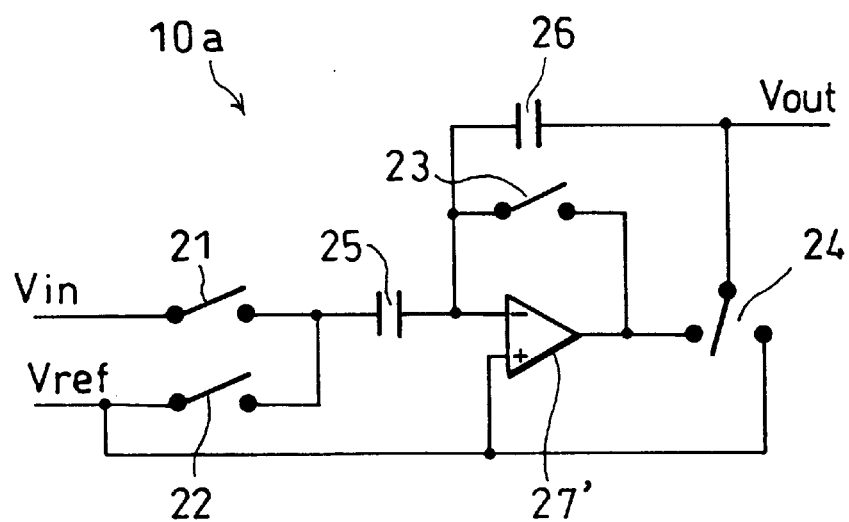
FIG. 15 which indicates one modified example of the above-mentioned embodiment, is a circuit diagram showing a sample-hold circuit with a refresh circuit wherein an operational amplifier in accordance with the present invention is adopted.

In the above-mentioned embodiment, an explanation was given by exemplifying a matched filter that is constituted by the sample-hold circuits 10, the adders 7 and 8, and the subtracters 9 wherein inverters are adopted, as illustrated in FIG. 3, FIG. 12 and FIG. 13; however, the refresh system of the present invention is also applicable to sample-hold circuits 10a as shown in FIG. 15 in which the inverters 27 of FIG. 3 are replaced by operational amplifiers. The offset-compensating system using the refreshing operation of the sample-hold circuits 10a of FIG. 15 and the control timing are the completely same as those of the sample-hold circuits 10 of FIG. 3. Therefore, the explanation of the components 21 through 27' of the sample-hold circuits of FIG. 14 is omitted. Similarly, the present invention is applicable to the circuit construction wherein the adders 7 and 8 of FIG. 11 and the inverters 27 of the subtracters 9 of FIG. 12 are replaced by operational amplifiers 27'.

Embodiment 2

In the first embodiment, an explanation was given of a matched filter which is modified so as to have an improved operational frequency and operation precision by providing sample-hold circuits 10 of m+n+3 steps. However, because of the increase of the number of extra sample-hold circuits 10 and complex timing for the refreshing operation, the circuit construction of the matched filter tends to become more complicated. Here, the present embodiment will explain a matched filter which is modified so as to have a better operational frequency and operation precision compared with conventional matched filters by providing sample-hold circuits of (m+1) steps, and which has a simpler circuit construction as compared with that of the first embodiment.

Figure 16:
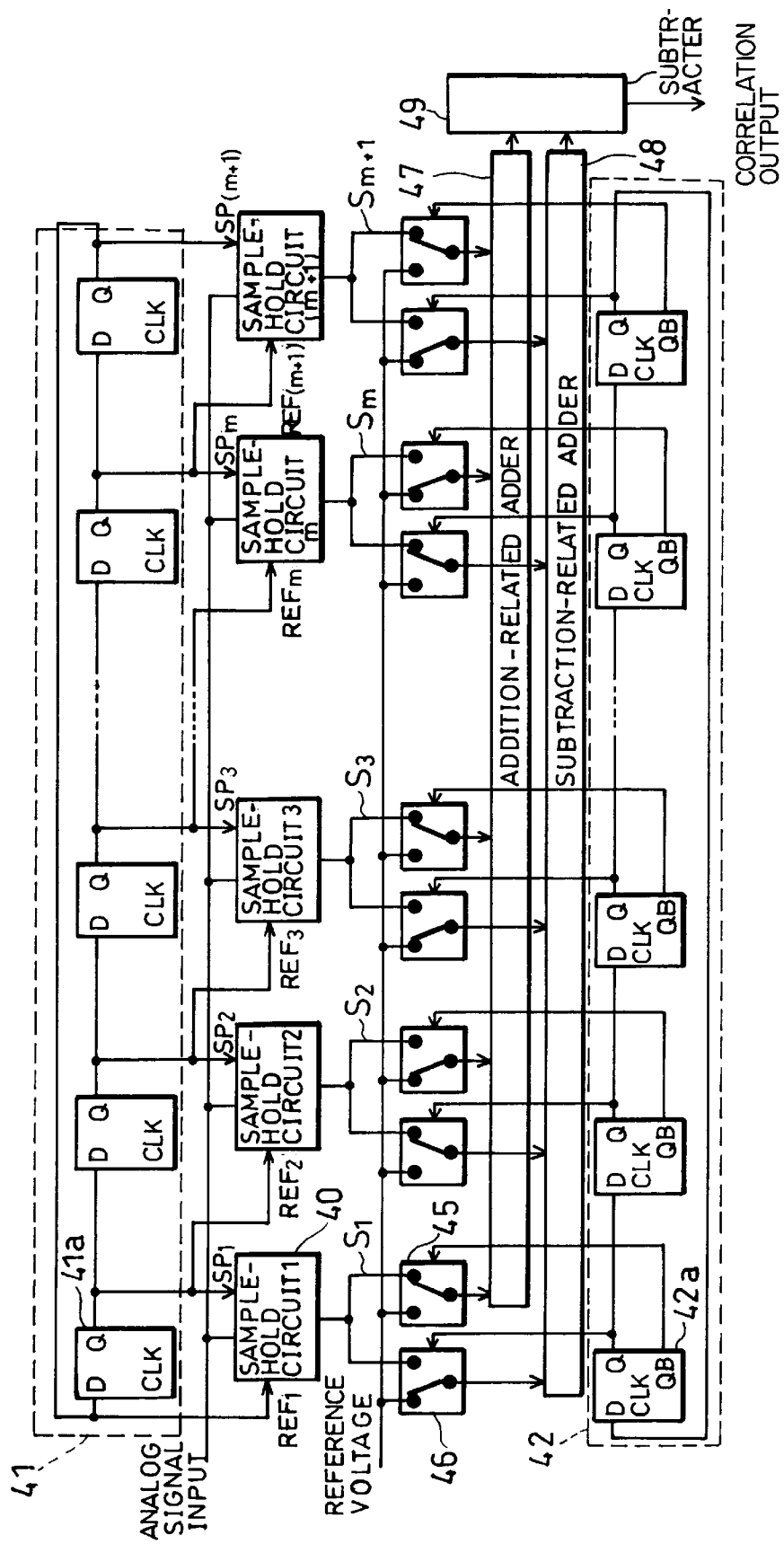
FIG. 16 is a block diagram showing a matched filter of the second embodiment of the present invention.

FIG. 16 shows the construction of a matched filter with m taps that is related to the present embodiment. In the matched filter, sample-hold circuits 40 of (m+1) steps are installed in place of the sample-hold circuits 10 of (m+n+3) steps shown in FIG. 1. In accordance with this construction, the number of steps of a sample-hold control register 41, a correlation-filter coefficient register 42 and respective multiplexors 45 and 46, as well as the number of the inputs of respective adders 47 and 48, are also set to (m+1) steps. Here, in the matched filter of FIG. 16, the sample-hold output-suppressing register 3 and multiplexor control circuits 4, shown in FIG. 1, are omitted, and the multiplexors 45 and 46 are directly controlled by the outputs Q and inversion outputs QB of D flip-flops 2a that constitute the correlation-filter coefficient register 42.

The sample-hold control register 41 is simply constituted by "(m+1)" number of D flipflops 41a that are connected in cascade. Further, the output of the D flipflop 41a at the last step is connected to the input of the D flipflop 41a at the first step, and the contents of the respective D flipflops 41a are thus allowed to shift cyclicly step by step for each input clock CLK. Moreover, the outputs Q of the D flipflops 41*a* are sent to the sample-hold circuits 40 at the corresponding steps as sampling signals SP, and also sent to the sample-hold circuits 40 at the next steps as refresh signals REF. Here, with respect to the contents of the D flipflops 41*a*, only one step has "1", and all the rest of steps have "0".

Figure 17:
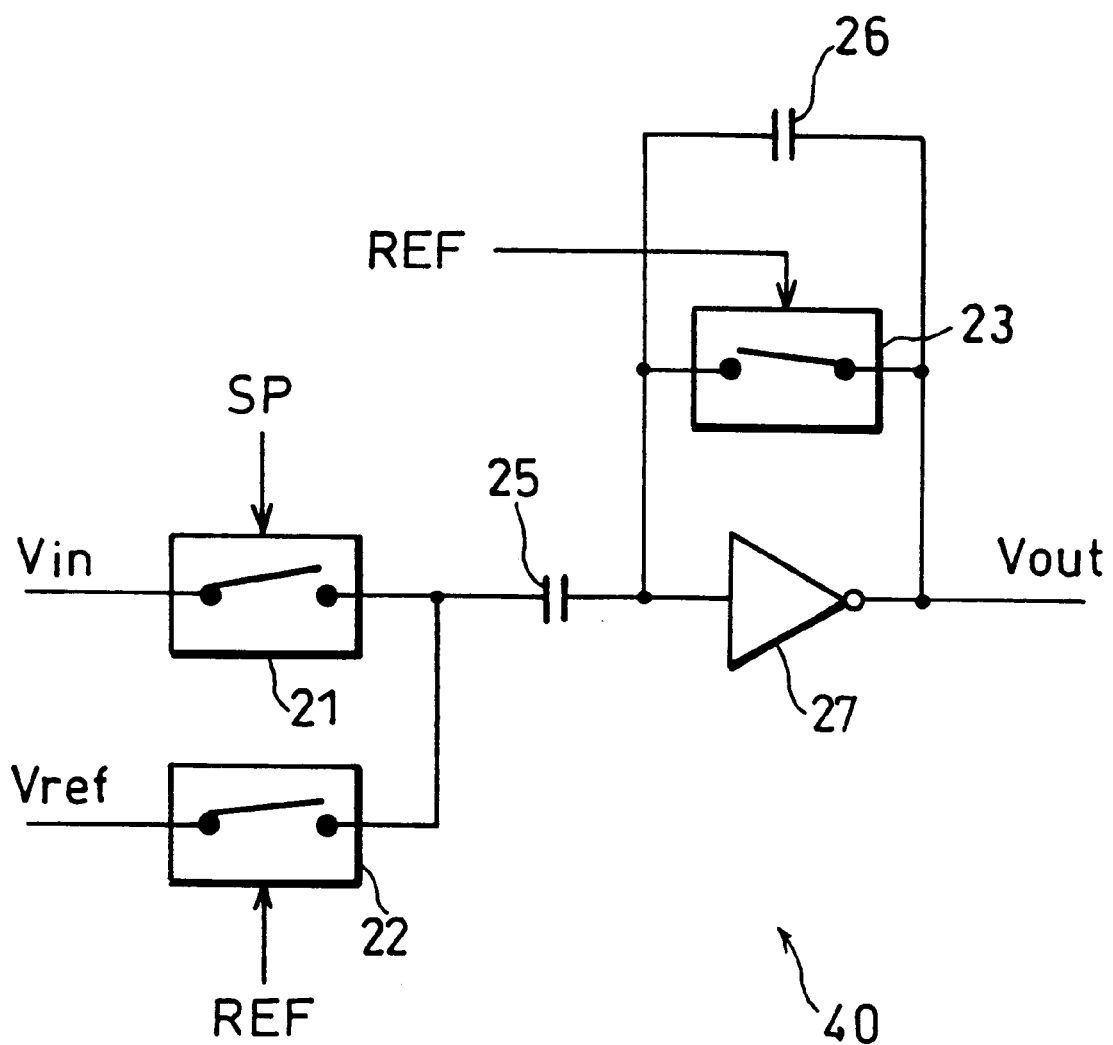
FIG. 17 is a circuit diagram showing a sample-hold circuit in the above-mentioned matched filter.
Figure 18:
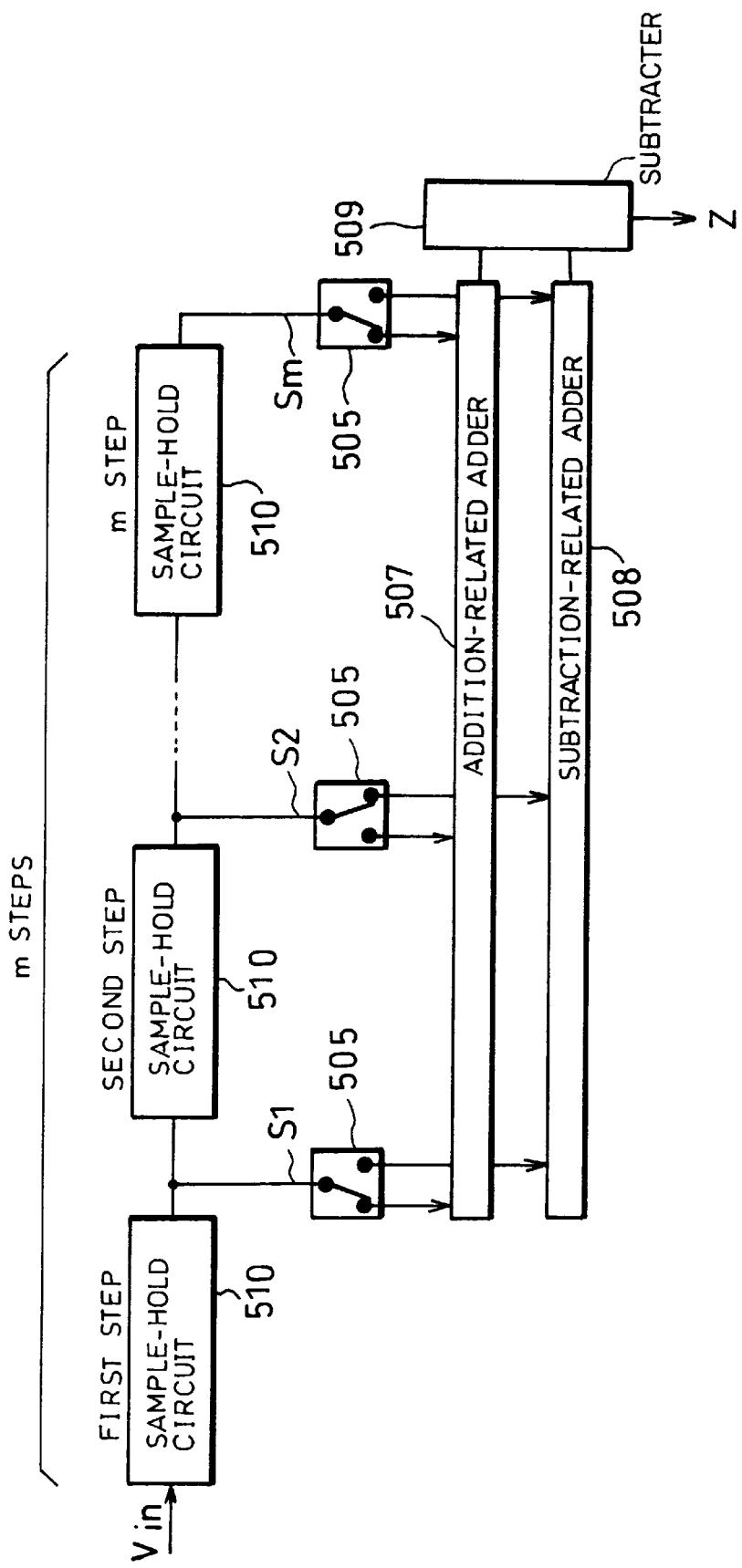
FIG. 18 which shows a prior art construction, is a block diagram of a matched filter.
Figure 19:
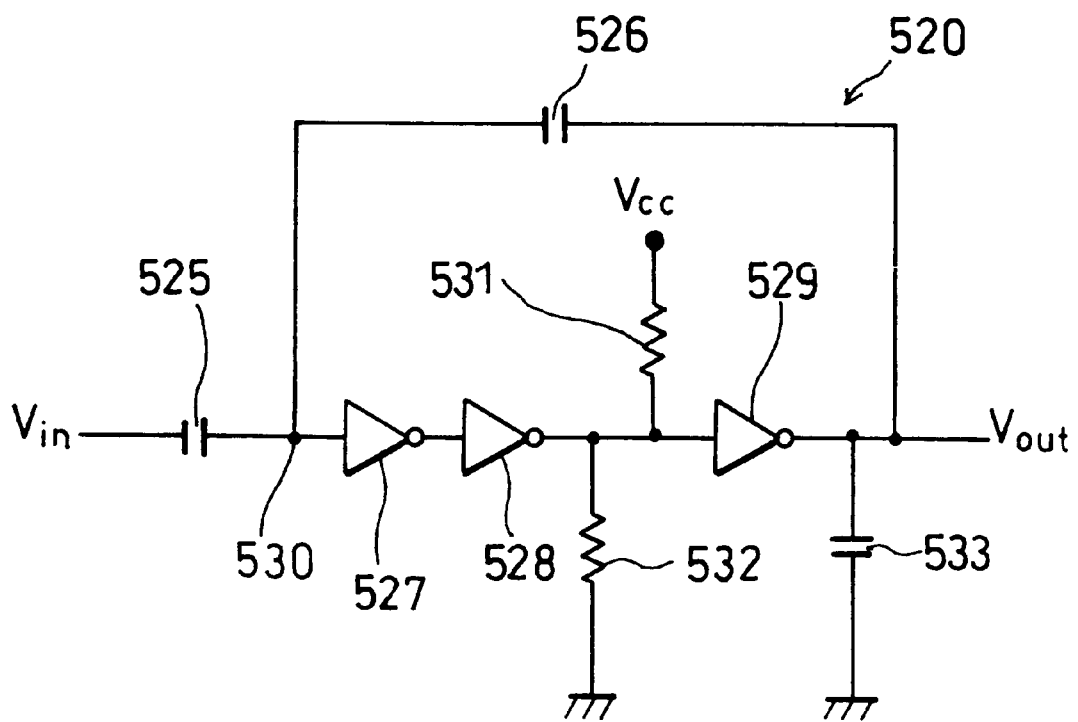
FIG. 19 is a circuit diagram showing an inversion amplifier that constitutes a sample-hold circuit in the above-mentioned matched filter.

As illustrated in FIG. 17, the sample-hold circuit 40 has virtually the same construction as the sample hold circuit 10 of FIG. 2 except that the switch 24 is omitted and that the feedback capacitor 26, the output of the inversion amplifier 27 and the output of the sample-hold circuit 40 are always connected. Further, the switch 21 is controlled to be connected and disconnected by the sampling signal SP, and the two switches 22 and 23 are controlled to be connected and disconnected by the refresh signal REF. Here, since the other construction is the same as that of the sample-hold circuit 10, the components that have the same functions are indicated by the same reference numerals, and the description thereof is omitted.

Thus, when the output Q of the D flipflop 41*a* is "1", the switch 21 is turned on in the sample-hold circuit 40 that is connected thereto and located at the same step. As a result, the sample-hold circuit 40 enters the holding state. Further, when the output is "0", the switch 21 is turned off, and the sample-hold circuit 40 enters the sampling state.

Moreover, the output Q of the D flipflop 41*a* of the corresponding step is the refresh signal REF at the next step, and in the sample-hold circuit 40 at the next step, when the refresh signal REF applied thereto is "1", the two switches 22 and 23 are turned on. Consequently, the sample-hold circuit 40 enters the refreshing state. In contrast, when the refresh signal REF is "0", the two switches 22 and 23 are turned off, thereby allowing the sample-hold circuit 40 to enter the normal operating state. The output of the first step of the sample-hold control register 41 is set at the sample signal SP of the sample-hold circuit 40 at the first step, and also equivalent to the refresh signal REF of the sample-hold circuit 40 at the next step. With these control operations, the sample-hold circuits 40 at the respective steps are allowed to repeat the refreshing, sampling and holding states in accordance with the input clock cycle Tc.

Unlike the sample-hold circuit 10 as shown FIG. 3, the sample-hold circuit 40 is controlled by the refresh signal REF and sample signal SP with respect to its refreshing, sampling and holding operations. Therefore, unlike the sample-hold control unit 1 as shown in FIG. 7, it is not necessary to install the AND circuits 1*b* through 1*e*, and the sample-hold control register 41 can be constructed by using only the D flipflops 41*a*.

Moreover, the correlation-filter coefficient register 42, which has (m+1) steps, is constituted by the D flipflops 42*a* that are connected in cascade, in the same manner as the correlation-filter coefficient register 2. The non-inversion output Q of each D flipflop 42*a* effects control of the addition-related product-operation multiplexor 45. Further, the inversion output QB effects control of the subtraction-related product-operation multiplexor 46. More specifically, when the output Q of the corresponding D flipflop 42*a* is "1", the addition-related product-operation multiplexor 45 selects the output Sn of the sample-hold circuit 40, and when the output thereof is "0", selects the reference voltage Vref. Similarly, when the inversion output QB of the corresponding D flipflop 42*a* is "1", the subtraction-related product-operation multiplexor 46 selects the output Sn of the sample-hold circuit 40, and when the output thereof is "0", selects the reference voltage Vref.

The circuit construction of FIG. 12 is also applied to each of the addition-related adders 47 and subtraction-related adders 48, in the same manner as the first embodiment. Similarly, the construction of FIG. 13 is applied to subtracters 49. Since the refreshing operation is required for these circuits 47 through 49 in the same manner as the first embodiment, the construction of FIG. 11 is used in the same manner as the first embodiment so that correlation outputs are not discontinued. Here, the number of the inputs of the two adders 47 and 48 are altered to m+1. With this arrangement, the subtracter 49 outputs a result of mutual correlation operations between the sample-value sequence S(x) of the analog input signal Vin and the correlation-filter coefficient P(t) for each input clock Tc of the matched filter.

Since the switches 22 and 23 of FIG. 17 conduct, the output Sn of the sample-hold circuit 40 during the refreshing operation is set virtually at the reference voltage Vref. For this reason, among the inputs of the addition-related and subtraction-related adders 47 and 48 of (m+1) steps, the input of any one of the steps of each group of adders is set at the reference voltage Vref, irrespective of the contents of the correlation-filter coefficient register 42, thereby causing no effects on the correlation operations. Therefore, the matched filter with this construction outputs the results of correlation operations with m taps for each input clock cycle Tc through the subtracters 49.

Additionally, in FIG. 16, an explanation was given of the matched filter that does not have sample-hold output-suppressing registers 3; however, the present invention is not limited to this construction. For example, the matched filter with (m+1) steps, shown in FIG. 16, may be modified by installing the sample-hold output-suppressing register 3 of FIG. 1 in the first embodiment so as to carry out correlation operation between the analog signal Vin and correlation-filter coefficients having a desired number of taps not more than "m" number of taps.

In the above-mentioned embodiment, an explanation was given by exemplifying a matched filter that is constituted by the sample-hold circuits, the adders and the subtracters wherein inverters are adopted, as illustrated in FIG. 3, FIG. 12 and FIG. 13; however, the refresh system of the present invention is also applicable to sample-hold circuits 10*a* as shown in FIG. 15 in which the inverters 27 of FIG. 3 are replaced by operational amplifiers. The offset-compensating system using the refreshing operation of the sample-hold circuits 10*a* of FIG. 15 and the control timing are described as follows: The connection/cutoff of the switches 22 through 24 of FIG. 15 is controlled by the control signal REF shown in FIG. 16. Here, the switch 24 of FIG. 15 selects the reference voltage Vref side when the control signal REF goes "H", and selects the output side of the operational amplifier 27' when the control signal REF goes "L". The connection/cutoff of the switch 21 is controlled by the control signal SP shown in FIG. 16. Since the other arrangements are the same as those shown in FIG. 2, the explanation thereof is omitted. Similarly, the refresh system of the present invention is also applicable to a circuit construction wherein the inverters of the adders of FIG. 12 and the subtracters of FIG. 13 are replaced by operational amplifiers.

As described above, the matched filter of the present invention, which, upon receipt of a predetermined input clock, carries out correlation operations between an analog signal and correlation filter coefficients the number of which is not more than the predetermined maximum length, is provided with: sample-hold circuits of the capacitive-coupling type, which are placed in parallel with each other with the number being at least more than the maximum length, which hold sampled values of the inputted analog signal during the time in which the input clocks are applied at least as many as the number of the correlation filter coefficients, and which have refresh sections for setting an operational reference electric potential respectively; a correlation filter coefficient register which is constituted by first registers that are installed in association with the sample-hold circuits and which allows first register values to cyclicly shift step by step for each input clock, the first register values being stored in the respective first registers, and representing the correlation efficiencies that are to be combined with the corresponding sample-hold circuits at the cycle of the input clock; an operation means for carrying out correlation operations based upon the combinations of the first register values of the correlation filter coefficient register and the outputs of the corresponding sample-hold circuits; and sample-hold control means which are installed as many as the number of the steps of the sample-hold circuits in a cyclic manner and which, upon releasing to the corresponding sample-hold circuit a control signal indicating one of sampling, refreshing and holding states, outputs the control signal having the same contents as the control signal at the previous step in the cycle of the input clock took place immediately before.

In the above-mentioned arrangement, the operation means discriminates correlation filter coefficients corresponding to the outputs of the respective sample-hold circuits based upon the first register values of the corresponding correlation filter coefficient register, and carries out correlation operations between the analog signal and the correlation filter coefficients.

The first register values of the correlation filter coefficient register are allowed to cyclicly shift step by step for each input clock; therefore, the output of each sample-hold circuit is subjected to a correlation operation with a correlation filter coefficient that has been offset in its order one by one for each input clock. Thus, during a period in which input clocks as many as the number of the correlation filter coefficients are applied, the outputs of the sample-hold circuits are subjected to correlation operations with all the correlation filter coefficients.

Moreover, when a refreshing operation is specified by the sample-hold control means, the refresh section of each sample-hold circuit sets the operational reference electric potential of the corresponding sample-hold circuit. Thus, it becomes possible to compensate for offset errors resulting from process deviations during production of the sample-hold circuits, such as process deviations of MOS (Metal Oxide Semiconductor) amplifiers, as well as offset errors due to leakage of charge from the capacitance during operation, such as leakage of charge of the floating gate nodes of the MOS amplifiers. As a result, the sample-hold circuits makes it possible to sample and hold analog signal with extremely high precision.

Furthermore, the respective sample-hold circuits are arranged in parallel with each other. Thus, unlike conventional matched filters where the respective sample-hold circuits are connected in cascade, the sample-hold circuits make it possible to sample and hold the analog signal without being affected by other sample-hold circuits, even if the other sample-holding circuits are in the refreshing state.

Here, the sample-hold circuit in the refreshing state does not contribute to the correlation operation since it can not hold the input voltage. Therefore, even in the case when the refresh sections are installed in the sample-hold circuits, if the number of the sample-hold circuits is set to the same number as the correlation filter coefficients, it is not possible to maintain the sample values required for the correlation operations, thereby causing errors in the correlation operation outputs.

In contrast, in the arrangement of the present invention, since the number of the sample-hold circuits is set to be greater than the number of the correlation filter coefficients, the sample values required for the correlation operations are held by the remaining sample-hold circuits even if a certain sample-hold circuit is in the refreshing state. Therefore, the matched filter can refresh the sample-hold circuits without giving adverse effects on the correlation outputs. Here, the time which is used for the refreshing operation can be increased or decreased by changing the number of extra sample-hold circuits.

In addition, the sample-hold control means releases a control signal that has the same contents as the control signal of the sample-hold control means at the previous step in the next cycle of the input clock. Consequently, the respective sample-hold circuits sequentially repeat the refreshing, sampling, and holding operations in one cycle of a period during which the input clocks are applied as many as the number of sampling and holding processes. Here, when the respective sample-hold circuits are mutually compared, their operations are delayed from the sample-hold circuit at the previous step by one cycle of the input clock. Further, the sample-hold control means carry out the same operations with only offset timing; therefore, the sample-hold control means can be constructed by using a shift register and a simple combinational circuit using.

Additionally, in order to replace the sample-hold circuits in the refreshing state, for example, it has been proposed that dedicated sample-hold circuits are provided. In this case, however, the dedicated sample-hold circuits should be arranged so that a sample-hold circuit that is to be replaced is selected in order for all the sample-hold circuits to be refreshed within a predetermined period. Further, the dedicated sample-hold circuits also need to be refreshed within a predetermined period, and during the refreshing period, they can not replace other sample-hold circuits. Therefore, in order to control the timing in which the dedicated sample-hold circuits replace other sample-hold circuits and also to control which sample-hold circuit should be selected, it is required to install a complicated circuit having sequential circuits, such as counters and flipflops, in addition to the above-mentioned circuit.

Moreover, with an arrangement wherein: sample-hold circuits of two systems are provided, and in the case of specifying the refreshing operation to all the sample-hold circuits of one system, while the sample and hold operations are specified to all the sample-hold circuits of the other system, it becomes possible to further simplify the circuit used for controlling the sample-hold circuits. However, in this case, the number of the sample-hold circuits required is at least twice the number of the correlation filter coefficients. Therefore, the area required for the sample-hold circuit section and power consumption increase approximately twice as much.

In contrast, the matched filter of the present invention only requires the necessary number of extra sample-hold circuits for maintaining a period required for the refreshing operation. As a result, as compared with the installation of two systems, it is possible to reduce the number of the sample-hold circuits. Moreover, as compared with the installation of dedicated sample-hold circuits, it becomes possible to achieve the sample-hold control means by using a simpler construction.

As a result, it is possible to simplify the entire construction of the matched filter without increasing the circuit area and power consumption so much, and consequently to provide a matched filter capable of performing correlation operations with high precision.

Furthermore, in addition to the above-mentioned arrangement, it is possible for the matched filter to be further provided with: an output-suppressing register which is constituted by second registers that are installed in association with the sample-hold circuits and which allows second register values to cyclicly shift step by step for each input clock, the second register values being stored in the respective second registers, and indicating whether or not the output of the corresponding sample-hold circuit contributes to a correlation operation at the cycle of the input clock; multiplexors which are placed between the sample-hold circuits and the operation means and which select either the outputs of the sample-hold circuits or the operational reference electric potential so as to input them to the operation means; and a multiplexor control means which, if the second register value indicates no contribution to the correlation operation, allows the corresponding multiplexor to select the operational reference electric potential.

With this arrangement, the outputs of the sample-hold circuits that do not conform to the correlation filter coefficients are not inputted to the operation means. As a result, if the number of the correlation filter coefficients is not more than the predetermined maximum length, the correlation operations can be carried out accurately. Moreover, merely by setting the contents of the output-suppressing register, correlation operations between a desired number of correlation filter coefficients that is not more than the maximum length and the analog signal can be carried out with high precision. Consequently, the matched filter can be used in a shared manner between applications requiring the different numbers of the correlation filter coefficients.

Here, the effect of the output-suppressing registers that enables the correlation operations of not more than the predetermined maximum length can be obtained even in the case when no refresh sections are installed in the sample-hold circuits and when the number of the sample-hold circuits is the same as the above-mentioned maximum length.

Furthermore, in addition to the above-mentioned arrangements, it is preferable for each of the sample-hold circuits to be further provided with a switch that is installed at the output end of the sample-hold circuit and that disconnects the output of the sample-hold circuit from the succeeding step during the period in which the sample-hold control means is outputting a control signal indicating the sample operation. With this arrangement, during the sample period, the outputs of the sample-hold circuits are cut off from, for example, wiring load up to the operation means and input load in the operation means. This makes it possible for the sample-hold circuits to acquire the analog signal with high speeds. Therefore, it is possible to improve the input clock frequency of the matched filter, and also to carry out correlation operations of, for example, high-frequency spread signals with high precision.

Moreover, in addition to the above-mentioned arrangements, it is preferable to install the following two components in the respective sample-hold circuits. One component is a multiplexor that is placed between the corresponding sample-hold circuit and the operation means and that selects either the output of the sample-hold circuit or the operational reference electric potential, and then inputs the result to the operation means; and the other is a multiplexor control means which, during a period including at least one of the periods in which the sample-hold control means at the corresponding step is outputting the control signal indicating the sample operation and in which it is outputting the control signal indicating the refreshing operation, allows the multiplexor to select the operational reference electric potential.

With this arrangement, during a period such as the sample period and refreshing period in which the outputs of the sample-hold circuits become unstable, the outputs in question are not inputted to the operation means. In particular, in the case when, during both of the sample period and refreshing period, the outputs are blocked from entering the operation means, only the outputs of the sample-hold circuits in the holding state are allowed to enter the operation means. Consequently, the operation precision of the matched filter is further improved.

In the case when the operation means includes adders and subtracters of the capacitive-coupling type, variations in the operational reference electric potential also occur in these circuits, thereby reducing the operation precision of the matched filter. Therefore, in this case, it is preferable for the operation means to have adders and subtracters of two systems, output multiplexors for selectively outputting one of the outputs of the two systems, and switching means for controlling the refreshing operation of each system and the switching operation of the multiplexors. In this arrangement, even during the refreshing operation of one system, the other system carries out correlation operations. Consequently, the correlation operations can be carried out without being suspended, and the operation precision of the matched filter is further improved.

Moreover, in each of the above-mentioned arrangements, it is preferable for the refresh section to set the input of the corresponding sample-hold circuit at the operational reference electric potential after the refreshing operation. This allows the input of the sample-hold circuit to be set at the center value between the maximum value and the minimum value of the analog signal at the time of the start of the sampling operation. Therefore, the maximum acquisition time for the input signal of the sample-hold circuit is reduced to as short as one-half at maximum, as compared with the case when no control is carried out with respect to the input electric potential of the sample-hold circuit. This makes it possible to improve the operational frequency of the matched filter.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A matched filter, which, each time a predetermined input clock is inputted thereto, carries out correlation operations between an analog signal and correlation filter coefficients the number of which is not more than a predetermined maximum length, comprising:

sample-hold circuits of a capacitive-coupling type, which are placed in parallel with each other with the number being at least more than the maximum length, which hold sampled values of the inputted analog signal during the time in which the input clocks are applied at least as many as the number of the correlation filter coefficients, and which have refresh sections for setting an operational reference electric potential respectively;

a correlation filter coefficient register which is constituted by first registers that are installed in association with the sample-hold circuits and which allows first register values to cyclicly shift step by step for each input clock, the first register values being stored in the respective first registers, and representing the correlation efficiencies that are to be combined with the corresponding sample-hold circuits at the cycle of the input clock;

an operation means for carrying out correlation operations based upon the combinations of the first register values of the correlation filter coefficient register and the outputs of the corresponding sample-hold circuits; and sample-hold control means which are installed as many as the number of the steps of the sample-hold circuits in a cyclic manner and which, upon releasing to the corresponding sample-hold circuit a control signal indicating one of sampling, refreshing and holding states, outputs the control signal having the same contents as the control signal at the previous step in the cycle of the input clock took place immediately before.

2. The matched filter as defined in claim 1, further comprising:

an output-suppressing register which is constituted by second registers that are installed in association with the sample-hold circuits and which allows second register values to cyclicly shift step by step for each input clock, the second register values being stored in the respective second registers, and indicating whether or not the output of the corresponding sample-hold circuit contributes to a correlation operation at the current cycle of the input clock;

multiplexors which are placed between the sample-hold circuits and the operation means and which select either the outputs of the sample-hold circuits or the operational reference electric potential so as to input them to the operation means; and multiplexor control means which, if the second register value indicates no contribution to the correlation operation, allows the corresponding multiplexor to select the operational reference electric potential.

3. The matched filter as defined in claim 1, wherein each of the sample-hold circuits includes a switch that is installed at an output end of the corresponding sample-hold circuit and that disconnects the output of the sample-hold circuit from the succeeding sample-hold circuit during a period in which the sample-hold control means is outputting a control signal indicating a sampling operation.

4. The matched filter as defined in claim 1, further comprising:

a multiplexor that is placed between the corresponding sample-hold circuit and the operation means and that selects either the output of the sample-hold circuit or the operational reference electric potential, and then inputs the result to the operation means; and multiplexor control means which, at least during a period in which the sample-hold control means at the corresponding step is outputting a control signal indicating a sampling operation, allows the multiplexor to select the operational reference electric potential, the multiplexor and the multiplexor control means being installed in association with each of the sample-hold circuits.

5. The matched filter as defined in claim 1, further comprising:

a multiplexor that is placed between the corresponding sample-hold circuit and the operation means and that selects either the output of the sample-hold circuit or the operational reference electric potential, and then inputs the result to the operation means; and multiplexor control means which, at least during a period in which the sample-hold control means at the corresponding step is outputting a control signal indicating a refreshing operation, allows the multiplexor to select the operational reference electric potential, the multiplexor and the multiplexor control means being installed in association with each of the sample-hold circuits.

6. The matched filter as defined in claim 5, wherein each of the multiplexor control means allows the multiplexor at the corresponding step to select the operational reference electric potential also during a period in which the sample-hold control means at the corresponding step is outputting a control signal indicating a sampling operation.

7. The matched filter as defined in claim 1, wherein the operation means comprises: addition-related and subtraction-related product-operation multiplexors that select and output either the output of the corresponding sample-hold circuit or the operational reference electric potential; and multiplexor control means for controlling the addition-related and subtraction-related product-operation multiplexors based upon the first register value of the correlation-filter coefficient register corresponding to the sample-hold circuit in question, the addition-related and subtraction-related multiplexors and the multiplexor control means being installed in association with each of the sample-hold circuits, the operation means further comprising: an addition-related adder to which the outputs of the addition-related product-operation multiplexor are inputted; a subtraction-related adder to which the outputs of the subtraction-related product-operation multiplexor are inputted; and a subtracter that outputs the difference between the outputs of the addition-related and subtraction-related adders as a correlation output.

8. The matched filter as defined in claim 7, wherein each of the multiplexor control means allows the addition-related and subtraction-related multiplexors to select the operational reference electric potential during a period including at least the period in which the sample-hold control means at the corresponding step is outputting the control signal indicating the sampling operation and the period in which the sample-hold control means is outputting the control signal indicating the refreshing operation.

9. The matched filter as defined in claim 7, wherein: the addition-related and subtraction-related adders are adders of a capacitive-coupling type, each having an adder refresh section; and two systems, each including the addition-related and subtraction-related product-operation multiplexors, the addition-related and subtraction-related adders and the subtracter, are provided, the matched filter further comprising: an output multiplexor for selecting and outputting one of the outputs of the subtracters of the two systems; and switching means which instructs the addition-related and subtraction-related adders and the subtracter of the system that has been selected by the output multiplexor to carry out a computing operation, as well as instructing the adder refresh section of the other system to carry out a refreshing operation.

10. The matched filter as defined in claim 1, wherein each of the refresh section sets the input of the corresponding sample-hold circuit at the operational reference electric potential after the refreshing operation.

11. The matched filter as defined in claim 1, wherein: each of the sample-hold circuits includes an amplifier for amplifying the inputs, an input capacitor having one end connected to the input of the amplifier, and a feedback capacitor that is placed between the input of the amplifier and the output of the corresponding sample-hold circuit; and the refresh section of the corresponding sample-hold circuit includes a first switch for short-circuiting and disconnecting the input and output of the amplifier, and a second switch that selects either the analog signal or the operational reference electric potential and applies it to the end of the input capacitor on the side opposite to the amplifier.

12. The matched filter as defined in claim 11, wherein each of the refresh sections further includes a third switch that selects either the operational reference electric potential or the output voltage of the amplifier and applies it to the end of the feedback capacitor on the output side.

13. The matched filter as defined in claim 11, wherein the number of the sample-hold circuits is set to be greater than the maximum length by one.

14. The matched filter as defined in claim 12, wherein supposing that the number of the sample-hold circuits is $\alpha$, the maximum length is m, and the length of a period in which the second and third switches are selecting the operational reference electric potential side is represented by n cycles of the input clock, n being a natural number, the following equation is satisfied:

$$\alpha = m + n + 3.$$

15. The matched filter as defined in claim 14, wherein each of the sample-hold control means, upon instructing refresh and sampling operations to the corresponding sample-hold circuit, allows the first switch to conduct during the n cycles of the input clock, allows the second and third switches to select the operational reference electric potential side during a period of conduction of the first switch as well as during a period of one cycle of the input clock immediately after said period, and outputs a control signal indicating a sampling operation after one cycle of the input clock has elapsed since the second and third switches selected the side that is different from the operational reference electric potential side.

16. A matched filter, which, each time a predetermined input clock is inputted thereto, carries out correlation operations between an analog signal and correlation filter coefficients the number of which is not more than a predetermined maximum length, comprising:

sample-hold circuits which are placed in parallel with each other with the number being at least the same as the maximum length and to which the analog signal is inputted;

a correlation filter coefficient register which is constituted by first registers that are installed in association with the sample-hold circuits and which allows first register values to cyclicly shift step by step for each input clock, the first register values indicating the correlation filter coefficients related to the corresponding sample-hold circuits at the current cycle of the input clock;

operation means for carrying out correlation operations based upon the combinations of the first register values of the correlation filter coefficient register and the outputs of the corresponding sample-hold circuits;

an output-suppressing register which is constituted by second registers that are installed in association with the sample-hold circuits and which allows second register values to cyclicly shift step by step for each input clock, the second register values indicating whether or not the output of the corresponding sample-hold circuit contributes to a correlation operation at the current cycle of the input clock;

multiplexors which are placed in association with the sample-hold circuits and which select either the outputs of the sample-hold circuits or the operational reference electric potential so as to input them to the operation means; and multiplexor control means which, if the second register value indicates no contribution to the correlation operation, allows the corresponding multiplexor to select the operational reference electric potential.

17. The matched filter as defined in claim 1, which is used for synchronism acquisition of a receiving signal of a spectrum spread communication system.

18. A control method of a matched filter that has a predetermined number of sample-hold circuits of a capacitive-coupling type, the sample-hold circuits being capable of sampling and holding an inputted analog signal and performing a refreshing operation and being placed in parallel with each other, and that carries out correlation operations between correlation filter coefficients and the analog signal based upon outputs of the sample-hold circuits and the correlation filter coefficients the number of which is smaller than the predetermined number each time an input clock is applied, the control method comprising:

a sampling step of, supposing that ordinal numbers are allocated to the sample-hold circuits cyclicly, at the time when one cycle of the input clock has elapsed from the time of sampling of the sample-hold circuit with one number before, allowing the corresponding sample-hold circuit to sample the analog signal;

a holding step of holding the value that has been sampled at the sampling step until at least a period obtained by multiplying the input clock cycle by the number of the correlation filter coefficients has elapsed; and a refreshing step of refreshing the corresponding sample-hold circuit between the holding step and the next sampling step.

* * * * *